United States Patent
Diev et al.

(10) Patent No.: US 10,862,037 B2
(45) Date of Patent: Dec. 8, 2020

(54) ELECTROACTIVE MATERIALS

(71) Applicant: LG Chem, Ltd., Seoul (KR)

(72) Inventors: Viacheslav V Diev, Wilmington, DE (US); Weiying Gao, Landenberg, PA (US); Weishi Wu, Landenberg, PA (US)

(73) Assignee: LG Chem, Ltd.

( * ) Notice: Subject to any disclaimer, the term of this patent is extended or adjusted under 35 U.S.C. 154(b) by 407 days.

(21) Appl. No.: 15/290,192

(22) Filed: Oct. 11, 2016

(65) Prior Publication Data

US 2017/0110664 A1 Apr. 20, 2017

Related U.S. Application Data

(60) Provisional application No. 62/242,338, filed on Oct. 16, 2015.

(51) Int. Cl.
| | | |
|---|---|---|
| H01L 51/00 | (2006.01) | |
| C08G 61/12 | (2006.01) | |
| C09K 11/06 | (2006.01) | |
| H01L 51/50 | (2006.01) | |

(52) U.S. Cl.
CPC .......... *H01L 51/0035* (2013.01); *C08G 61/12* (2013.01); *C08G 61/124* (2013.01); *C09K 11/06* (2013.01); *H01L 51/0043* (2013.01); *C08G 2261/1412* (2013.01); *C08G 2261/312* (2013.01); *C08G 2261/3162* (2013.01); *C08G 2261/3241* (2013.01); *C08G 2261/412* (2013.01); *C08G 2261/522* (2013.01); *C08G 2261/95* (2013.01); *C09K 2211/1007* (2013.01); *C09K 2211/1014* (2013.01); *C09K 2211/1022* (2013.01); *C09K 2211/1029* (2013.01); *H01L 51/5024* (2013.01); *H01L 51/5056* (2013.01); *H01L 51/5072* (2013.01); *H01L 51/5088* (2013.01); *H01L 51/5092* (2013.01)

(58) Field of Classification Search
CPC ...... C08G 2261/1412; C08G 2261/312; C08G 2261/3162; C08G 2261/3241; C08G 2261/412; C08G 2261/522; C08G 2261/95; C08G 61/12; C08G 61/124; C09K 11/06; C09K 2211/1007; C09K 2211/1014; C09K 2211/1022; C09K 2211/1029; H01L 51/0035; H01L 51/0043; H01L 51/5024; H01L 51/5056; H01L 51/5072; H01L 51/5088; H01L 51/5092

See application file for complete search history.

(56) References Cited

U.S. PATENT DOCUMENTS

| | | | |
|---|---|---|---|
| 4,356,244 A * | 10/1982 | Leichter | G03G 5/09 252/501.1 |
| 6,670,645 B2 | 12/2003 | Grushin et al. | |
| 7,504,162 B2 * | 3/2009 | Nomura | C07D 209/88 257/40 |
| 9,382,206 B2 * | 7/2016 | Kato | C07D 209/86 |
| 9,705,091 B2 * | 7/2017 | Ikeda | H01L 51/0067 |
| 9,847,489 B1 * | 12/2017 | Shin | C08G 61/122 |
| 2002/0103332 A1 * | 8/2002 | Leclerc | C08G 73/0672 528/423 |
| 2003/0008172 A1 * | 1/2003 | Leclerc | H01L 51/0035 428/690 |
| 2003/0091862 A1 * | 5/2003 | Tokito | C08G 61/02 428/690 |
| 2003/0092880 A1 * | 5/2003 | Leclerc | C08G 73/0672 528/422 |
| 2004/0087761 A1 * | 5/2004 | Fujiki | C08G 73/0611 528/423 |
| 2004/0102577 A1 | 5/2004 | Hsu et al. | |
| 2004/0127637 A1 | 7/2004 | Hsu et al. | |
| 2005/0158578 A1 * | 7/2005 | Iwakuma | C09K 11/06 428/690 |

(Continued)

FOREIGN PATENT DOCUMENTS

| | | | |
|---|---|---|---|
| JP | 2006-306997 A | * | 11/2006 |
| JP | 2008174661 A | * | 7/2008 |

(Continued)

OTHER PUBLICATIONS

Wang, Y., Kirk-Othmer Encyclopedia of Chemical Technology, Fourth Edition, vol. 18, 1996, (Book Not Included).

(Continued)

*Primary Examiner* — Dawn L Garrett
(74) *Attorney, Agent, or Firm* — Lerner, David, Littenberg, Krumholz & Mentlik, LLP

(57) ABSTRACT

There is provided a compound having Formula I

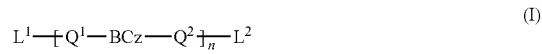

(I)

In Formula I: BCz is a substituted or unsubstituted benzocarbazole unit; $L^1$ and $L^2$ are the same or different and are H, D, halogen, aryl, arylamino, crosslinkable groups, deuterated aryl, deuterated arylamino, or deuterated crosslinkable groups; $Q^1$ and $Q^2$ are the same or different and are a single bond, alkyl, aryl, heteroaryl, diarylamino, triarylamino, deuterated alkyl, deuterated aryl, deuterated heteroaryl, deuterated diarylamino, or deuterated triarylamino; and n is an integer greater than 0, with the proviso that when n=1, $L^1$ and $L^2$ are Cl, Br, crosslinkable groups or deuterated crosslinkable groups.

13 Claims, 2 Drawing Sheets

(56) References Cited

U.S. PATENT DOCUMENTS

| | | |
|---|---|---|
| 2005/0184287 A1 | 8/2005 | Herron et al. |
| 2005/0205860 A1 | 9/2005 | Hsu et al. |
| 2008/0061685 A1* | 3/2008 | Chesterfield ........ H01L 51/0035 313/504 |
| 2009/0207346 A1* | 8/2009 | Ohuchi .............. H01L 51/0039 349/69 |
| 2012/0049120 A1* | 3/2012 | Chen ...................... C09D 11/10 252/301.35 |
| 2014/0323723 A1* | 10/2014 | Ahn ..................... C07D 401/14 544/212 |
| 2015/0249215 A1* | 9/2015 | Ono ................... C08G 73/0672 257/40 |
| 2015/0263289 A1* | 9/2015 | Kim ................... H01L 51/0072 257/40 |
| 2016/0005981 A1* | 1/2016 | Kim ..................... C07D 403/14 257/40 |
| 2016/0336518 A1* | 11/2016 | Chun ................... C09K 11/06 |
| 2017/0117488 A1* | 4/2017 | Ahn ..................... H01L 51/0073 |
| 2017/0125682 A1* | 5/2017 | Ha ....................... C09K 11/025 |
| 2017/0283379 A1* | 10/2017 | Kwon ................. C07D 403/14 |
| 2018/0305337 A1* | 10/2018 | Shim .................... C07D 401/14 |

FOREIGN PATENT DOCUMENTS

| | | |
|---|---|---|
| JP | 2015-021073 A * | 2/2015 |
| WO | 2003/008424 A1 | 1/2003 |
| WO | 2003/040257 A1 | 5/2003 |
| WO | 2003/063555 A1 | 7/2003 |
| WO | 2003/091688 A2 | 11/2003 |
| WO | 2004/016710 A1 | 2/2004 |
| WO | 2005/052027 A1 | 6/2005 |
| WO | 2007/145979 A3 | 4/2008 |
| WO | WO 2013-111713 A1 * | 8/2013 |

OTHER PUBLICATIONS

Gustafsson, G. et al. "Flexible light-emitting diodes made from soluble conducting polymers" Letters to Nature, vol. 357, Jun. 11, 1992, pp. 477-479.

Frischeisen, J. et. al., "Determination of molecular dipole orientation in doped fluorescent organic thin films by photoluminescence measurements", Applied Physics Letters, 2010, 96, 073302.

CRC Handbook of Chemistry ANO Physics, 81st Edition, 2000 (Book Not Included).

* cited by examiner

ELECTROACTIVE MATERIALS

CLAIM OF BENEFIT OF PRIOR APPLICATION

This application claims the benefit of U.S. Provisional Application No. 62/242,338, filed Oct. 16, 2015, which is incorporated in its entirety herein by reference.

BACKGROUND INFORMATION

Field of the Disclosure

The present disclosure relates to novel electroactive compounds. The disclosure further relates to electronic devices having at least one layer comprising such an electroactive compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a compound having Formula I

 (I)

wherein:
BCz is a substituted or unsubstituted benzocarbazole unit, described in detail below;
$L^1$ and $L^2$ are the same or different and are selected from the group consisting of H, D, halogen, aryl, arylamino, crosslinkable groups, deuterated aryl, deuterated arylamino, and deuterated crosslinkable groups;
$Q^1$ and $Q^2$ are the same or different and are selected from the group consisting of a single bond, alkyl, aryl, heteroaryl, diarylamino, triarylamino, deuterated alkyl, deuterated aryl, deuterated heteroaryl, deuterated diarylamino, and deuterated triarylamino; and
n is an integer greater than 0, with the proviso that when n=1, $L^1$ and $L^2$ are selected from the group consisting of Cl, Br, crosslinkable groups and deuterated crosslinkable groups.

There is also provided a monomeric unit having Formula II

 (II)

wherein:
BCz, $Q^1$, and $Q^2$ are as defined above for Formula I; and
# indicates a point of attachment.

There is also provided a copolymer having Formula III

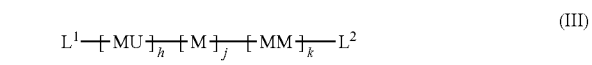 (III)

wherein:
MU is a monomeric unit having Formula II;
M and MM are different and are monomeric units;
h, j, and k are mole fractions such that h+j+k=1, where h and j are non-zero; and
$L^1$ and $L^2$ are as defined above for Formula I.

There is also provided an electronic device having at least one layer comprising a compound, polymer or copolymer having any of the above formulae.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
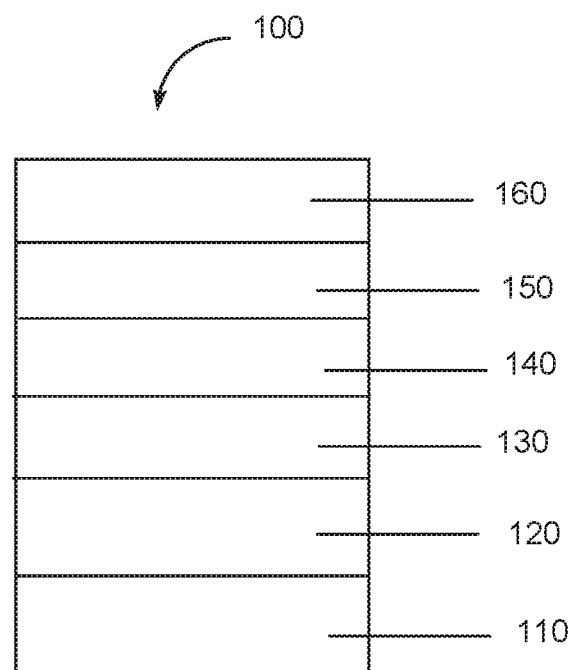
FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a compound having Formula I, as described in detail below.

There is further provided a monomeric unit having Formula II, as described in detail below.

There is further provided a copolymer having Formula III, as described in detail below.

There is further provided an electronic device having at least one layer comprising a compound, polymer or copolymer having any of the above formulae.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Compound of Formula I, the Monomeric Unit Having Formula II and the Copolymer Having Formula III, the Electronic Device, and finally Examples.

1. Definitions and Clarification of Terms

Before addressing details of embodiments described below, some terms are defined or clarified.

Unless otherwise specifically defined, R, R', R" and any other variables are generic designations. The specific definitions for a given formula herein are controlling for that formula.

As used herein, the term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "aromatic compound" is intended to mean an organic compound comprising at least one unsaturated cyclic group having 4n+2 delocalized pi electrons. The term is intended to encompass both aromatic compounds having only carbon atoms within the cyclic group, and heteroaromatic compounds wherein one or more of the carbon atoms within the cyclic group has been replaced by another atom, such as nitrogen, oxygen, sulfur, or the like.

The term "aryl" or "aryl group" means a moiety derived from an aromatic compound. A group "derived from" a compound, indicates the radical formed by removal of one or more H or D. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl. anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include hydrocarbon aryl group and heteroaryl groups. Heteroaryl groups may have from 4-50 ring carbon atoms; in some embodiments, 4-30 ring carbon atoms.

The term "alkoxy" is intended to mean the group —OR, where R is alkyl.

The term "aryloxy" is intended to mean the group —OR, where R is aryl.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxy, siloxane, thioalkoxy, —S(O)$_2$—, —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, fluoroalkyl, silyl, germyl, aryl, heteroaryl, or triarylamino group. R' and R", together with the nitrogen atom to which they are bound, can form a ring system in certain embodiments. Substituents may also be crosslinking groups. Any of the preceding groups with available hydrogens may also be deuterated.

The term "benzocarbazole unit" refers to one of the three isomers shown below, where the numbers indicate the positions on the core.

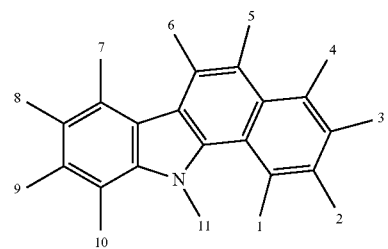

A

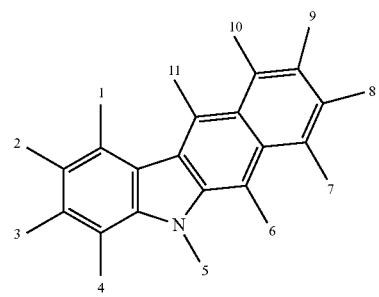

B

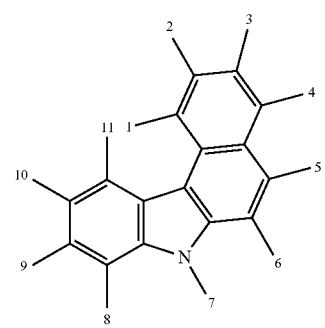

C

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), cycloalkenes, and acetylenic groups.

The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The prefix "hetero" indicates that one or more carbon atoms have been replaced with a different atom. In some embodiments, the different atom is N, O, or S.

The term "host material" is intended to mean a material, usually in the form of a layer, to which a dopant may be added. The host material may or may not have electronic characteristic(s) or the ability to emit, receive, or filter radiation.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating or printing. Discontinuous deposition techniques include, but are not limited to, ink jet printing, gravure printing, and screen printing.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The terms "luminescent material", "emissive material" and "emitter" are intended to mean a material that emits light when activated by an applied voltage (such as in a light-emitting diode or light-emitting electrochemical cell). The term "blue luminescent material" is intended to mean a material capable of emitting radiation that has an emission maximum at a wavelength in a range of approximately 445-490 nm.

The term "organic electronic device" or sometimes just "electronic device" is intended to mean a device including one or more organic semiconductor layers or materials.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "siloxane" refers to the group $R_3SiOR_2Si$—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

The term "siloxy" refers to the group $R_3SiO$—, where R is the same or different at each occurrence and is H, D, C1-20 alkyl, deuterated alkyl, fluoroalkyl, aryl, or deuterated aryl.

The term "silyl" refers to the group $R_3Si$—, where R is the same or different at each occurrence and is H, D, C1-20 alkyl, deuterated alkyl, fluoroalkyl, aryl, or deuterated aryl. In some embodiments, one or more carbons in an R alkyl group are replaced with Si.

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each $sp^3$ carbon atom is assumed to have enough bonded hydrogen atoms in order to give it a total of four bonds; each $sp^2$ carbon, three bonds; each sp carbon, two bonds. Thus, for example, toluene is depicted as

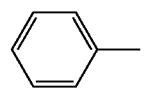

In a structure where a substituent bond passes through one or more rings as shown below,

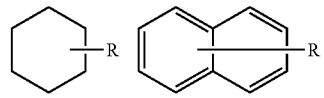

it is meant that the substituent R may be bonded at any available position on the one or more rings.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond). Exemplary adjacent R groups are shown below:

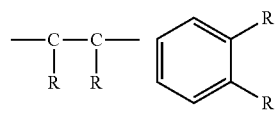

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each sp$^3$ carbon atom is assumed to have enough bonded hydrogen atoms in order to give it a total of four bonds; each sp$^2$ carbon, three bonds; each sp carbon, two bonds. The depictions of formulae herein are examples of the use of the line-angle formula convention.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Compounds of Having Formula I

In some embodiments, the compounds having Formula I are useful as emissive materials. In some embodiments, the compounds are blue emissive materials. They can be used alone or as a dopant in a host material.

In some embodiments, the compounds having Formula I have a photoluminescence y-coordinate of less than 0.15, according to the C.I.E. chromaticity scale (Commission Internationale de L'Eclairage, 1931); in some embodiments, less than 0.10; in some embodiments, less than 0.090.

In some embodiments, electroluminescent devices including the compounds of Formula I as emissive materials have deep blue color. In some embodiments, the blue emission has an x-coordinate less than 0.15 and a y-coordinate less than 0.10, according to the C.I.E. chromaticity scale; in some embodiments, the y-coordinate is less than 0.090.

In some embodiments, the photoluminescence emission profile has a width at half the maximum intensity ("FWHM") that is less than 75 nm; in some embodiments, less than 60 nm; in some embodiments, less than 50 nm. This is advantageous for display devices for producing more saturated color.

In some embodiments, the compounds having Formula I are useful as hosts for emissive dopants.

In some embodiments, the electroactive compound has Formula I

(I)

wherein:
BCz is a substituted or unsubstituted benzocarbazole unit, described in detail below;
L$^1$ and L$^2$ are the same or different and are selected from the group consisting of H, D, halogen, aryl, arylamino, crosslinkable groups, deuterated aryl, deuterated arylamino, and deuterated crosslinkable groups;
Q$^1$ and Q$^2$ are the same or different and are selected from the group consisting of a single bond, alkyl, aryl, heteroaryl, diarylamino, triarylamino, deuterated alkyl, deuterated aryl, deuterated heteroaryl, deuterated diarylamino, and deuterated triarylamino; and
n is an integer greater than 0, with the proviso that when n=1, L$^1$ and L$^2$ are selected from the group consisting of Cl, Br, crosslinkable groups and deuterated crosslinkable groups.

The compound having Formula I can be a small molecule with n=1, an oligomer, or a polymer. As used herein, the term "compound having Formula I" is intended to include small molecules, oligomers and polymers.

In some embodiments of Formula I, n=1 and L$^1$ is Cl or Br. Such compounds can be useful as monomers for the formation of polymeric compounds.

In some embodiments of Formula I, n=1 and L$^1$=Br.

In some embodiments of Formula I, n=1 and L$^2$ is Cl or Br. In some embodiments of Formula I, n=1 and L$^2$=Br.

In some embodiments of Formula I, n=1 and L$^1$ is a crosslinking group or deuterated crosslinking group.

In some embodiments of Formula I, n=1 and L$^2$ is a crosslinking group or deuterated crosslinking group.

In some embodiments of Formula I, n=2-10.

In some embodiments of Formula I, the compound is a homopolymer with n>10. In some embodiments, n=10-10$^6$; in some embodiments, n=10-100,000; in some embodiments, n=10-1000.

In some embodiments of Formula I, n is an integer such that the compound is a homopolymer with a weight average molecular weight ("Mw") >20 kDa, where kDa represents 1000 dalton atomic mass units; in some embodiments, Mw>50 kDa. In some embodiments, Mw=10-1000 kDa; in some embodiments, Mw=20-500 kDa; in some embodiments, Mw=20-200 kDa.

The polymers having Formula I (Mw>20 kDa) can be formed into films by depositing on a substrate from a suitable solvent. In some embodiments, films of polymers having Formula I have a molecular orientation that is more horizontal than a totally random orientation. The term "horizontal orientation" refers to molecules having transition dipole moments lying parallel to the substrate. Since light emits mainly in the direction perpendicular to the transition dipole moment of the emitting molecule, a vertically oriented emitter molecule has most emitted light confined inside the device and wasted due to total reflection at various interfaces. A horizontally oriented emitter molecule has most light coupled out of the device and therefore has much enhanced efficiency. The molecular transition dipole orientation can be determined using angular dependent measurement of the photoluminescence (PL) emission spectrum of the emitting layer as compared to numerical simulations. Such a method has been discussed by D. Yokoyama, et. al., in Appl. Phys. Lett. 96, 073302 (2010).

In some embodiments of Formula I, n>10 and $L^1$ is selected from aryl, arylamino, crosslinkable groups, and deuterated analogs thereof.

In some embodiments of Formula I, n>10 and $L^2$ is selected from aryl, arylamino, crosslinkable groups, and deuterated analogs thereof.

In some embodiments of Formula I, n>10 and $L^1$ is selected from phenyl, biphenyl, diphenylamino, and deuterated analogs thereof.

In some embodiments of Formula I, n>10 and $L^2$ is selected from phenyl, biphenyl, diphenylamino, and deuterated analogs thereof.

In some embodiments, the compound having Formula I is deuterated. In some embodiments, the compound is at least 10% deuterated. By "% deuterated" or "% deuteration" is meant the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, deuteration is present on the benzocarbazole group.

In some embodiments of Formula I, deuteration is present on one or more substituent groups on the benzocarbazole group.

In some embodiments of Formula I, deuteration is present on one or more of $Q^1$ and $Q^2$.

In some embodiments of Formula I, deuteration is present on any combination of the benzocarbazole group, and one or more substituent groups on the benzocarbazole, $Q^1$ and $Q^2$.

In some embodiments of Formula I, BCz is selected from the group consisting of BCz-A, BCz-B, and BCz-C

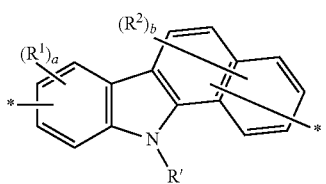
BCz-A

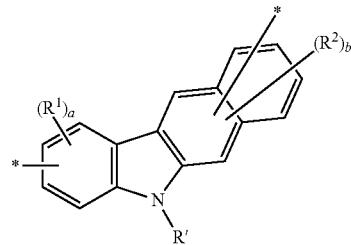
BCz-B

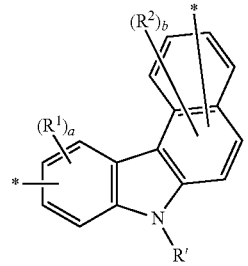
BCz-C wherein:

R' is selected from the group consisting of alkyl, cycloalkyl, fluoroalkyl, silyl, germyl, aryl, heteroaryl, triarylamino, and deuterated analogs thereof;

$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;

a is an integer from 0-3;

b is an integer from 0-5; and

* indicates a point of attachment to $Q^1$ or $Q^2$.

In some embodiments of BCz-A, BCz-B, and BCz-C, R' is a hydrocarbon aryl group having 6-36 ring carbons or deuterated analog. The hydrocarbon aryl group has no heteroatoms within the ring structure and can include one or more single ring groups bonded together, one or more fused rings, or combinations thereof.

In some embodiments of BCz-A, BCz-B, and BCz-C, R' is a hydrocarbon aryl group and has at least one substituent selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

In some embodiments of BCz-A, BCz-B, and BCz-C, R' has no heteroaromatic groups.

In some embodiments of BCz-A, BCz-B, and BCz-C, R' has Formula a

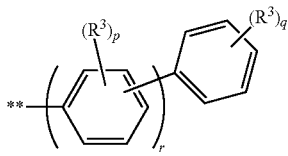

Formula a where:
R³ is the same or different at each occurrence and is selected from the group consisting of D, alkyl, alkoxy, siloxane, silyl, germyl, deuterated alkyl, deuterated alkoxy, deuterated siloxane, deuterated silyl, and deuterated germyl, where adjacent R³ groups can be joined together to form a fused aromatic ring or a deuterated fused aromatic ring;
p is the same or different at each occurrence and is an integer from 0-4;
q is an integer from 0-5;
r is an integer from 1 to 5; and
** indicates a point of attachment to N.

In some embodiments of BCz-A, BCz-B, and BCz-C, R' has Formula b

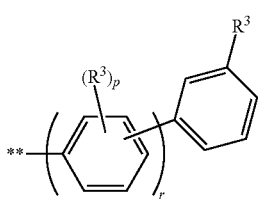

Formula b where R³, p, r and ** are as in Formula a.

In some embodiments of BCz-A, BCz-B, and BCz-C, R' is selected from the group consisting of phenyl, naphthyl, anthracenyl, a group derived from benz[de]anthracene, Formula a, and deuterated analogs thereof.

In some embodiments of BCz-A, BCz-B, and BCz-C, R' is a heteroaryl group having at least one ring atom which is selected from the group consisting of N, O, and S.

In some embodiments of BCz-A, BCz-B, and BCz-C, R' is an N-heteroaryl group, having at least one ring atom that is N.

In some embodiments, the N-heteroaryl is derived from a compound selected from the group consisting of pyrrole, pyridine, pyrimidine, carbazole, imidazole, benzimidazole, imidazolobenzimidazole, triazole, benzotriazole, triazolopyridine, indole, indolocarbazole, phenanthroline, quinoline, isoquinoline, quinoxaline, substituted derivatives thereof, and deuterated analogs thereof.

In some embodiments of BCz-A, BCz-B, and BCz-C, R' is an alkyl or deuterated alkyl having 1-20 carbons; in some embodiments, 1-12 carbons; in some embodiments, 3-8 carbons.

In some embodiments of BCz-A, BCz-B, and BCz-C, a=0.

In some embodiments of BCz-A, BCz-B, and BCz-C, a=1.

In some embodiments of BCz-A, BCz-B, and BCz-C, a=2.

In some embodiments of BCz-A, BCz-B, and BCz-C, a=3.

In some embodiments of BCz-A, BCz-B, and BCz-C, a>0.

In some embodiments of BCz-A, BCz-B, and BCz-C, a>0 and at least one $R^1$ is D.

In some embodiments of BCz-A, BCz-B, and BCz-C, a>0 and at least one $R^1$ is an alkyl or deuterated alkyl having 1-20 carbons; in some embodiments, 1-12 carbons; in some embodiments, 3-8 carbons.

In some embodiments of BCz-A, BCz-B, and BCz-C, a>0 and at least one $R^1$ is a hydrocarbon aryl group having 6-36 ring carbons. The hydrocarbon aryl group can include one or more single ring groups bonded together, one or more fused rings, or combinations thereof.

In some embodiments of BCz-A, BCz-B, and BCz-C, b=0.

In some embodiments of BCz-A, BCz-B, and BCz-C, b=1.

In some embodiments of BCz-A, BCz-B, and BCz-C, b=2.

In some embodiments of BCz-A, BCz-B, and BCz-C, b=3.

In some embodiments of BCz-A, BCz-B, and BCz-C, b=2.

In some embodiments of BCz-A, BCz-B, and BCz-C, b=3.

In some embodiments of BCz-A, BCz-B, and BCz-C, b>0.

All of the above-described embodiments for $R^1$ apply equally to $R^2$.

In some embodiments of Formula I, BCz is BCz-A, and $Q^1$ is bonded to position 7.

In some embodiments of Formula I, BCz is BCz-A, and $Q^1$ is bonded to position 8.

In some embodiments of Formula I, BCz is BCz-A, and $Q^1$ is bonded to position 9.

In some embodiments of Formula I, BCz is BCz-A, and $Q^1$ is bonded to position 10.

In some embodiments of Formula I, BCz is BCz-A, and $Q^2$ is bonded to position 1.

In some embodiments of Formula I, BCz is BCz-A, and $Q^2$ is bonded to position 2.

In some embodiments of Formula I, BCz is BCz-A, and $Q^2$ is bonded to position 3.

In some embodiments of Formula I, BCz is BCz-A, and $Q^2$ is bonded to position 4.

In some embodiments of Formula I, BCz is BCz-A, and $Q^2$ is bonded to position 5.

In some embodiments of Formula I, BCz is BCz-A, and $Q^2$ is bonded to position 6.

In some embodiments of Formula I, BCz is selected from the group consisting of BCz-A1, BCz-B1, and BCz-C1

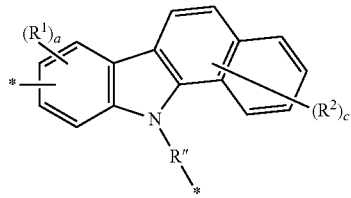

BCz-A1

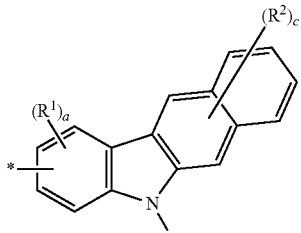

BCz-B1

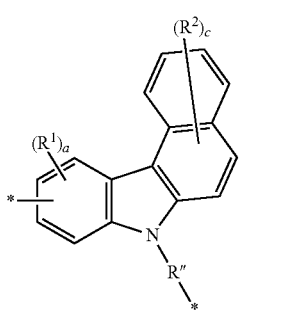

BCz-C1 where
R" is selected from the group consisting of alkyl, cycloalkyl, fluoroalkyl, silyl, germyl, aryl, heteroaryl, triarylamino, and deuterated analogs thereof;
$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;
a is an integer from 0-3;
c is an integer from 0-6; and
* indicates a point of attachment to $Q^1$ or $Q^2$.

In some embodiments of BCz-A1, BCz-B1, and BCz-C1, R" is a hydrocarbon aryl group having 6-36 ring carbons or deuterated analog. The hydrocarbon aryl group can include one or more single ring groups bonded together, one or more fused rings, or combinations thereof.

In some embodiments of BCz-A1, BCz-B1, and BCz-C1, R" is a hydrocarbon aryl group and has at least one selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

In some embodiments of BCz-A1, BCz-B1, and BCz-C1, R" has no heteroaromatic groups.

In some embodiments of BCz-A1, BCz-B1, and BCz-C1, R" has Formula c

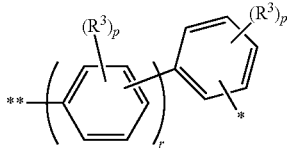

Formula c where:
$R^3$ is the same or different at each occurrence and is selected from the group consisting of D, alkyl, alkoxy, siloxane, silyl, germyl, deuterated alkyl, deuterated alkoxy, deuterated siloxane, deuterated silyl, and deuterated germyl, where adjacent $R^3$ groups can be joined together to form a fused aromatic ring or a deuterated fused aromatic ring;
p is the same or different at each occurrence and is an integer from 0-4;
r is an integer from 1 to 5;
* indicates a point of attachment to $Q^1$ or $Q^2$; and
** indicates a point of attachment to N.

In some embodiments of BCz-A1, BCz-B1, and BCz-C1, R" has Formula d

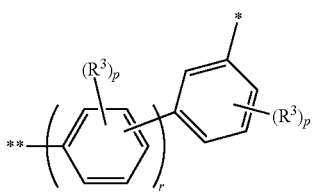

Formula d where $R^3$, p, r, * and ** are as in Formula c.

In some embodiments of BCz-A1, BCz-B1, and BCz-C1, R" is selected from the group consisting of phenyl, naphthyl, anthracenyl, a group derived from benz[de]anthracene, Formula c, and deuterated analogs thereof.

In some embodiments of BCz-A1, BCz-B1, and BCz-C1, R" is a heteroaryl group having at least one ring atom which is selected from the group consisting of N, O, and S.

In some embodiments of BCz-A1, BCz-B1, and BCz-C1, R" is an N-heteroaryl group, having at least one ring atom that is N.

In some embodiments of BCz-A1, BCz-B1, and BCz-C1, R" is an alkyl or deuterated alkyl having 1-20 carbons; in some embodiments, 1-12 carbons; in some embodiments, 3-8 carbons.

In some embodiments of BCz-A1, BCz-B1, and BCz-C1, c=0.

In some embodiments of BCz-A1, BCz-B1, and BCz-C1, c=1.

In some embodiments of BCz-A1, BCz-B1, and BCz-C1, c=2.

In some embodiments of BCz-A1, BCz-B1, and BCz-C1, c=3.

In some embodiments of BCz-A1, BCz-B1, and BCz-C1, c=4.

In some embodiments of BCz-A1, BCz-B1, and BCz-C1, c=5.

In some embodiments of BCz-A1, BCz-B1, and BCz-C1, c=6.

In some embodiments of BCz-A1, BCz-B1, and BCz-C1, c>0.

All of the above-described embodiments for $R^1$, $R^2$, and a in BCz-A apply equally to $R^1$, $R^2$, and a in BCz-A1, BCz-B1, and BCz-C1.

In some embodiments of Formula I, BCz is selected from the group consisting of BCz-A2, BCz-B2, and BCz-C2

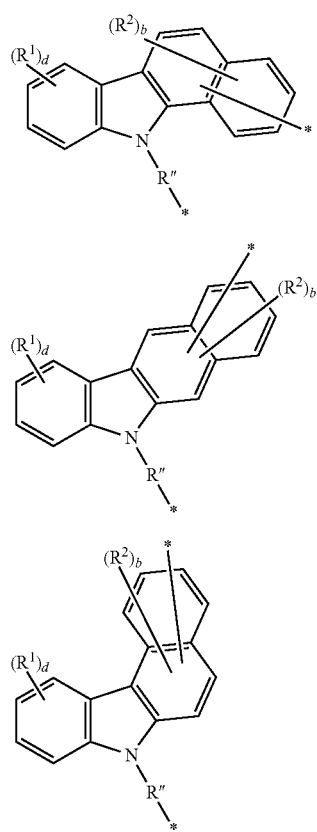

BCz-A2

BCz-B2

BCz-C2 where
R" is selected from the group consisting of alkyl, cycloalkyl, fluoroalkyl, silyl, germyl, aryl, heteroaryl, triarylamino, and deuterated analogs thereof;
$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;
b is an integer from 0-5;
d is an integer from 0-4; and
* indicates a point of attachment to $Q^1$ or $Q^2$.

In some embodiments of BCz-A2, BCz-B2, and BCz-C2, d=0.
In some embodiments of BCz-A2, BCz-B2, and BCz-C2, d=1.
In some embodiments of BCz-A2, BCz-B2, and BCz-C2, d=2.
In some embodiments of BCz-A2, BCz-B2, and BCz-C2, d=3.
In some embodiments of BCz-A2, BCz-B2, and BCz-C2, d=4.
In some embodiments of BCz-A2, BCz-B2, and BCz-C2, d>0.

All of the above-described embodiments for R" in BCz-A1 apply equally to R" in BCz-A2, BCz-B2, and BCz-C2.
All of the above-described embodiments for $R^1$, $R^2$, and b in BCz-A apply equally to $R^1$, $R^2$, and b in BCz-A2, BCz-B2, and BCz-C2.

In some embodiments of Formula I, BCz is BCz-A or BCz-A1, and $Q^1$ is bonded to position 7.
In some embodiments of Formula I, BCz is BCz-A or BCz-A1, and $Q^1$ is bonded to position 8.
In some embodiments of Formula I, BCz is BCz-A or BCz-A1, and $Q^1$ is bonded to position 9.
In some embodiments of Formula I, BCz is BCz-A or BCz-A1, and $Q^1$ is bonded to position 10.
In some embodiments of Formula I, BCz is BCz-B or BCz-B1, and $Q^1$ is bonded to position 1.
In some embodiments of Formula I, BCz is BCz-B or BCz-B1, and $Q^1$ is bonded to position 2.
In some embodiments of Formula I, BCz is BCz-B or BCz-B1, and $Q^1$ is bonded to position 3.
In some embodiments of Formula I, BCz is BCz-B or BCz-B1, and $Q^1$ is bonded to position 4.
In some embodiments of Formula I, BCz is BCz-C or BCz-C1, and $Q^1$ is bonded to position 8.
In some embodiments of Formula I, BCz is BCz-C or BCz-C1, and $Q^1$ is bonded to position 9.
In some embodiments of Formula I, BCz is BCz-C or BCz-C1, and $Q^1$ is bonded to position 10.
In some embodiments of Formula I, BCz is BCz-C or BCz-C1, and $Q^1$ is bonded to position 11.
In some embodiments of Formula I, BCz is BCz-A or BCz-A2, and $Q^2$ is bonded to position 1.
In some embodiments of Formula I, BCz is BCz-A or BCz-A2, and $Q^2$ is bonded to position 2.
In some embodiments of Formula I, BCz is BCz-A or BCz-A2, and $Q^2$ is bonded to position 3.
In some embodiments of Formula I, BCz is BCz-A or BCz-A2, and $Q^2$ is bonded to position 4.
In some embodiments of Formula I, BCz is BCz-A or BCz-A2, and $Q^2$ is bonded to position 5.
In some embodiments of Formula I, BCz is BCz-A or BCz-A2, and $Q^2$ is bonded to position 6.
In some embodiments of Formula I, BCz is BCz-B or BCz-B2, and $Q^2$ is bonded to position 6.
In some embodiments of Formula I, BCz is BCz-B or BCz-B2, and $Q^2$ is bonded to position 7.
In some embodiments of Formula I, BCz is BCz-B or BCz-B2, and $Q^2$ is bonded to position 8.
In some embodiments of Formula I, BCz is BCz-B or BCz-B2, and $Q^2$ is bonded to position 9.
In some embodiments of Formula I, BCz is BCz-B or BCz-B2, and $Q^2$ is bonded to position 10.
In some embodiments of Formula I, BCz is BCz-B or BCz-B2, and $Q^2$ is bonded to position 11.
In some embodiments of Formula I, BCz is BCz-C or BCz-C2, and $Q^2$ is bonded to position 1.
In some embodiments of Formula I, BCz is BCz-C or BCz-C2, and $Q^2$ is bonded to position 2.
In some embodiments of Formula I, BCz is BCz-C or BCz-C2, and $Q^2$ is bonded to position 3.
In some embodiments of Formula I, BCz is BCz-C or BCz-C2, and $Q^2$ is bonded to position 4.
In some embodiments of Formula I, BCz is BCz-C or BCz-C2, and $Q^2$ is bonded to position 5.

In some embodiments of Formula I, BCz is BCz-C or BCz-C2, and $Q^2$ is bonded to position 6.

In some embodiments, at least one of $Q^1$ and $Q^2$ is not a single bond.

In some embodiments of Formula I, $Q^1=Q^2$.

In some embodiments of Formula I, $Q^1 \neq Q^2$.

In some embodiments of Formula I, $Q^1$ is a single bond.

In some embodiments of Formula I, $Q^1$ is an alkyl or deuterated alkyl having 1-20 carbons; in some embodiments, 1-12 carbons; in some embodiments, 3-8 carbons.

In some embodiments of Formula I, $Q^1$ is a hydrocarbon aryl group having 6-36 ring carbons or deuterated analog. The hydrocarbon aryl group can include one or more single ring groups bonded together, one or more fused rings, or combinations thereof.

In some embodiments of Formula I, $Q^1$ is a hydrocarbon aryl group and has at least one substituent selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

In some embodiments of Formula I, $Q^1$ has no heteroaromatic groups.

In some embodiments of Formula I, $Q^1$ has Formula c, as defined above.

In some embodiments of Formula I, $Q^1$ has Formula d, as defined above.

In some embodiments of Formula I, $Q^1$ is selected from the group consisting of phenyl, naphthyl, anthracenyl, a group derived from benz[de]anthracene, Formula c, and deuterated analogs thereof.

In some embodiments of Formula I, $Q^1$ is a heteroaryl group having at least one ring atom which is selected from the group consisting of N, O, and S.

In some embodiments of Formula I, $Q^1$ is an N-heteroaryl group, having at least one ring atom that is N.

In some embodiments of Formula I, $Q^1$ is a diarylamino group having Formula e

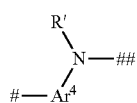

Formula e where:
R' is selected from the group consisting of alkyl, cycloalkyl, fluoroalkyl, silyl, germyl, aryl, heteroaryl, triarylamino, and deuterated analogs thereof;
$Ar^4$ is selected from the group consisting of aryl, heteroaryl, and deuterated analogs thereof;
# indicates a point of attachment; and
## indicates a point of attachment to BCz.

In some embodiments of Formula e, R' is an alkyl or deuterated alkyl group having 1-20 carbons; in some embodiments, 1-12 carbons; in some embodiments, 3-8 carbons.

In some embodiments of Formula e, R' is a hydrocarbon aryl group having 6-36 ring carbons or deuterated analog. The hydrocarbon aryl group can include one or more single ring groups bonded together, one or more fused rings, or combinations thereof.

In some embodiments of Formula e, R' is a hydrocarbon aryl group and has at least one substituent selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

In some embodiments of Formula e, R' has no heteroaromatic groups.

In some embodiments of Formula e, R' has Formula a, as defined above.

In some embodiments of Formula e, R' has Formula b, as defined above.

In some embodiments of Formula e, R' is selected from the group consisting of phenyl, naphthyl, anthracenyl, a group derived from benz[de]anthracene, Formula a, and deuterated analogs thereof.

In some embodiments of Formula e, R' is a heteroaryl group having at least one ring atom which is selected from the group consisting of N, O, and S.

In some embodiments of Formula e, R' is an N-heteroaryl group, having at least one ring atom that is N.

In some embodiments of Formula e, $Ar^4$ is a hydrocarbon aryl group having 6-46 ring carbons or deuterated analog. The hydrocarbon aryl group can include one or more single ring groups bonded together, one or more fused rings, or combinations thereof.

In some embodiments of Formula e, $Ar^4$ is a hydrocarbon aryl group and has at least one substituent selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

In some embodiments of Formula e, $Ar^4$ has no heteroaromatic groups.

In some embodiments of Formula e, $Ar^4$ has Formula c1

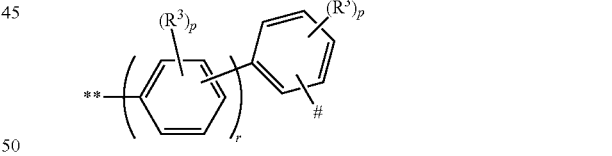

Formula c1 where:
$R^3$ is the same or different at each occurrence and is selected from the group consisting of D, alkyl, alkoxy, siloxane, silyl, germyl, deuterated alkyl, deuterated alkoxy, deuterated siloxane, deuterated silyl, and deuterated germyl, where adjacent $R^3$ groups can be joined together to form a fused aromatic ring or a deuterated fused aromatic ring;

p is the same or different at each occurrence and is an integer from 0-4;

r is an integer from 1 to 5;

# indicates a point of attachment; and

** indicates a point of attachment to N.

In some embodiments of Formula e, $Ar^4$ has Formula d1

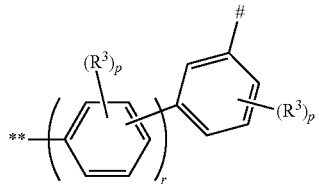

Formula d1 where $R^3$, p, r, # and ** are as in Formula c1.

In some embodiments of Formula e, $Ar^4$ is selected from the group consisting of phenyl, naphthyl, anthracenyl, a group derived from benz[de]anthracene, Formula c1, and deuterated analogs thereof.

In some embodiments of Formula I, $Q^1$ is a triarylamino group having Formula f

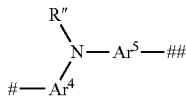

Formula f where:
R" is selected from the group consisting of alkyl, cycloalkyl, fluoroalkyl, silyl, germyl, aryl, heteroaryl, triarylamino, and deuterated analogs thereof;
$Ar^4$, and $Ar^5$ are the same or different and are selected from the group consisting of aryl, heteroaryl, and deuterated analogs thereof;
# indicates a point of attachment; and
## indicates a point of attachment to BCz.

In some embodiments of Formula f, $Ar^4=Ar^5$.
In some embodiments of Formula f, $Ar^4 \neq Ar^5$.
In some embodiments of Formula f, $Ar^5$ is a hydrocarbon aryl group having 6-56 ring carbons or deuterated analog. The hydrocarbon aryl group can include one or more single ring groups bonded together, one or more fused rings, or combinations thereof.

In some embodiments of Formula f, $Ar^5$ is a hydrocarbon aryl group and has at least one substituent selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

In some embodiments of Formula f, $Ar^5$ has no heteroaromatic groups.

In some embodiments of Formula f, $Ar^5$ has Formula c2

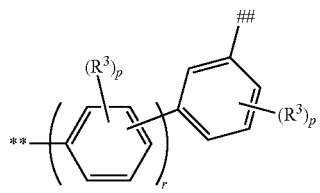

Formula c2 where:
$R^3$ is the same or different at each occurrence and is selected from the group consisting of D, alkyl, alkoxy, siloxane, silyl, germyl, deuterated alkyl, deuterated alkoxy, deuterated siloxane, deuterated silyl, and deuterated germyl, where adjacent $R^3$ groups can be joined together to form a fused aromatic ring or a deuterated fused aromatic ring;
p is the same or different at each occurrence and is an integer from 0-4;
r is an integer from 1 to 5;
## indicates a point of attachment to BCz; and
** indicates a point of attachment to N.

In some embodiments of Formula f, $Ar^5$ has Formula d2

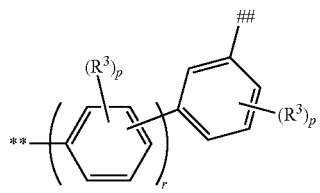

Formula d2 where $R^3$, p, r, ##, and ** are as in Formula c2.

In some embodiments of Formula f, $Ar^5$ is selected from the group consisting of phenyl, naphthyl, anthracenyl, a group derived from benz[de]anthracene, Formula c2, and deuterated analogs thereof.

All of the above-described embodiments for R' and $Ar^4$ in Formula e apply equally to R" and $Ar^4$ in Formula f.

In some embodiments of Formula I, the compound has Formula I-a

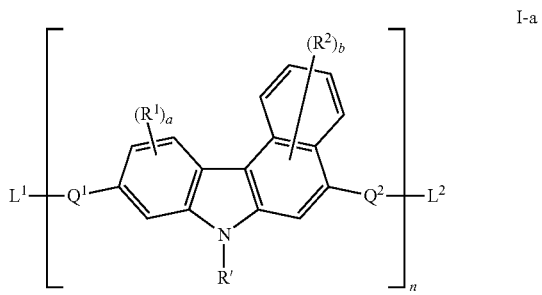

I-a wherein:
R' is selected from the group consisting of alkyl, cycloalkyl, fluoroalkyl, silyl, germyl, aryl, heteroaryl, triarylamino, and deuterated analogs thereof;
$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;
$L^1$ and $L^2$ are the same or different and are selected from the group consisting of H, D, halogen, aryl, arylamino, crosslinkable groups, deuterated aryl, deuterated arylamino, and deuterated crosslinkable groups;
$Q^1$ and $Q^2$ are the same or different and are selected from the group consisting of a single bond, alkyl, aryl, heteroaryl, diarylamino, triarylamino, deuterated alkyl, deuterated aryl, deuterated heteroaryl, deuterated diarylamino, and deuterated triarylamino;

a is an integer from 0-3;

b is an integer from 0-5; and n is an integer greater than 0, with the proviso that when n=1, $L^1$ and $L^2$ are selected from the group consisting of Cl, Br, crosslinkable groups and deuterated crosslinkable groups.

In some embodiments of Formula I, the compound has Formula I-b

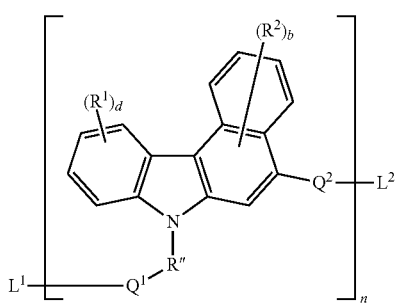

I-b wherein:
R" is selected from the group consisting of alkyl, cycloalkyl, fluoroalkyl, silyl, germyl, aryl, heteroaryl, triarylamino, and deuterated analogs thereof;

$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;

$L^1$ and $L^2$ are the same or different and are selected from the group consisting of H, D, halogen, aryl, arylamino, crosslinkable groups, deuterated aryl, deuterated arylamino, and deuterated crosslinkable groups;

$Q^1$ and $Q^2$ are the same or different and are selected from the group consisting of a single bond, alkyl, aryl, heteroaryl, diarylamino, triarylamino, deuterated alkyl, deuterated aryl, deuterated heteroaryl, deuterated diarylamino, and deuterated triarylamino;

b is an integer from 0-5;

d is an integer from 0-4; and n is an integer greater than 0, with the proviso that when n=1, $L^1$ and $L^2$ are selected from the group consisting of Cl, Br, crosslinkable groups and deuterated crosslinkable groups.

In some embodiments of Formula I, the compound has Formula I-c

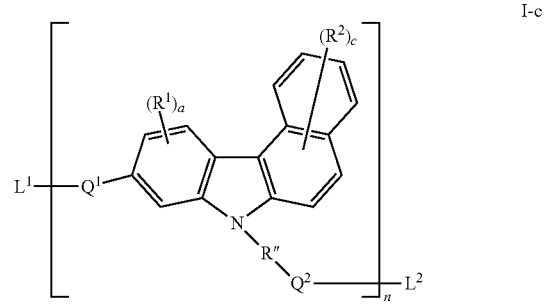

I-c wherein:
R" is selected from the group consisting of alkyl, cycloalkyl, fluoroalkyl, silyl, germyl, aryl, heteroaryl, triarylamino, and deuterated analogs thereof;

$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;

$L^1$ and $L^2$ are the same or different and are selected from the group consisting of H, D, halogen, aryl, arylamino, crosslinkable groups, deuterated aryl, deuterated arylamino, and deuterated crosslinkable groups;

$Q^1$ and $Q^2$ are the same or different and are selected from the group consisting of a single bond, alkyl, aryl, heteroaryl, diarylamino, triarylamino, deuterated alkyl, deuterated aryl, deuterated heteroaryl, deuterated diarylamino, and deuterated triarylamino;

a is an integer from 0-3;

c is an integer from 0-6; and n is an integer greater than 0, with the proviso that when n=1, $L^1$ and $L^2$ are selected from the group consisting of Cl, Br, crosslinkable groups and deuterated crosslinkable groups.

All of the above-described embodiments for R', R", $L^1$, $L^2$, $R^1$, $R^2$, $Q^1$, $Q^2$, a, a b, c, d, and n in Formula I, apply equally to R', R", $L^1$, $L^2$, $R^1$, $R^2$, $Q^1$, $Q^2$, a, b, c, d, and n in Formula I-a, Formula I-b, and Formula I-c.

Any of the above embodiments of Formula I can be combined with one or more of the other embodiments, so long as they are not mutually exclusive. For example, the embodiment in which a=1, can be combined with the embodiments in which $R^1$=D, and the embodiment in which BCz=BCz-B, and the embodiment where R' is phenyl. The same is true for the other non-mutually-exclusive embodiments discussed above. The skilled person would understand which embodiments were mutually exclusive and would thus readily be able to determine the combinations of embodiments that are contemplated by the present application.

Any of the above embodiments of Formula I-a, Formula I-b, or Formula I-c can be likewise combined with one or more of the other embodiments, so long as they are not mutually exclusive.

The compounds of Formula I can be made using any technique that will yield a C—C or C—N bond and known polymerization techniques. A variety of such techniques are known, such as Suzuki, Yamamoto, Stille, and metal-catalyzed C—N couplings as well as metal catalyzed and oxidative direct arylation.

For example, Compound I-6 (below) may be prepared as:
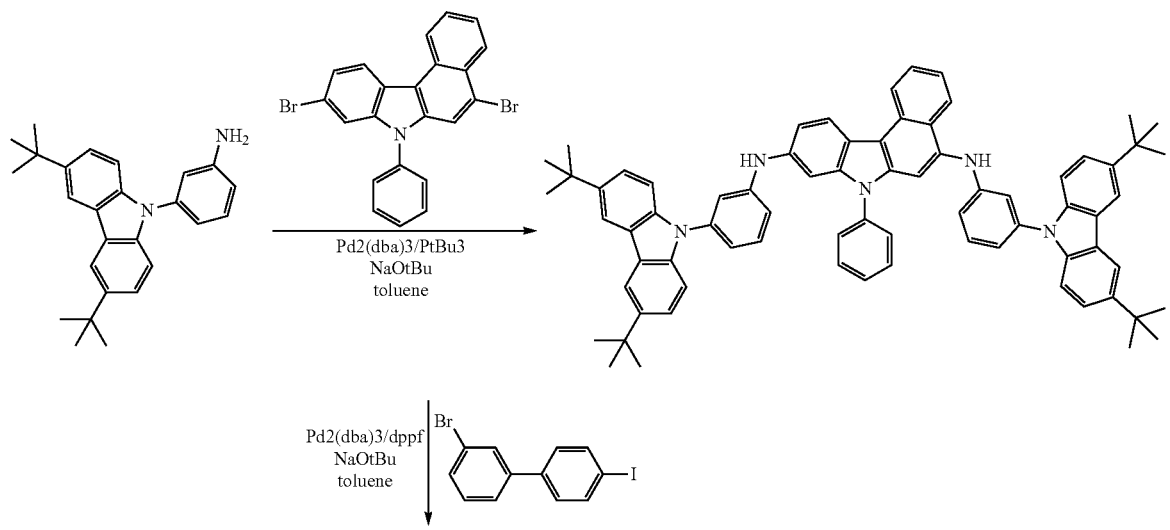
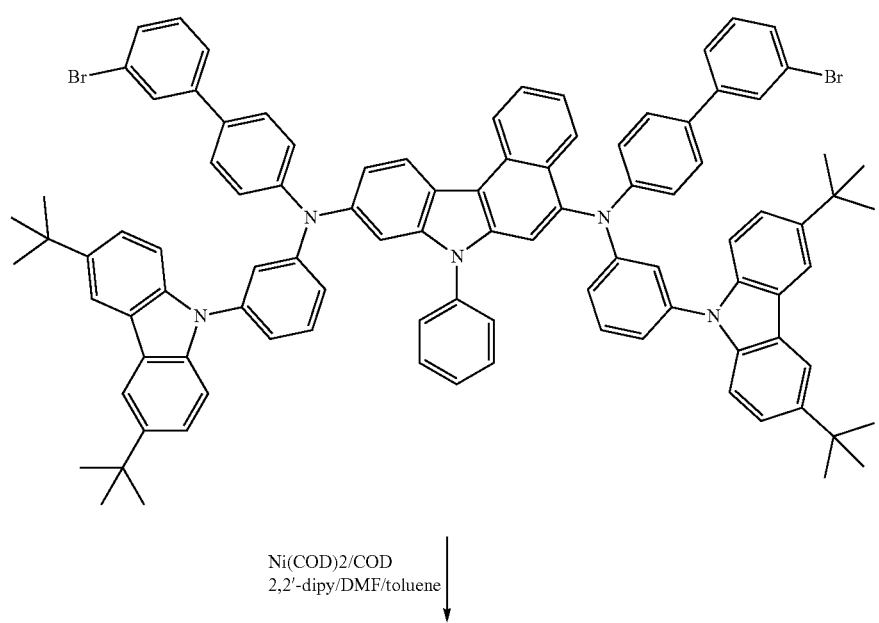

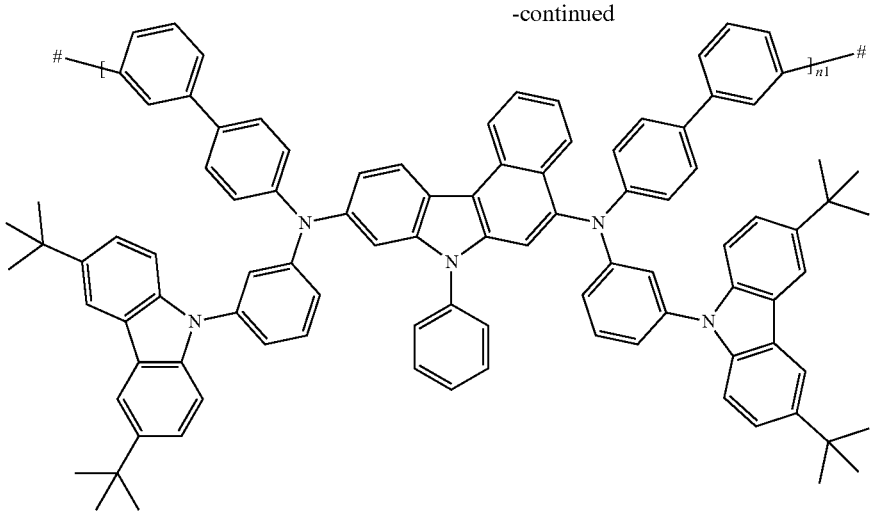
Compound I-6
and Compound I-11 (below) may be prepared as:
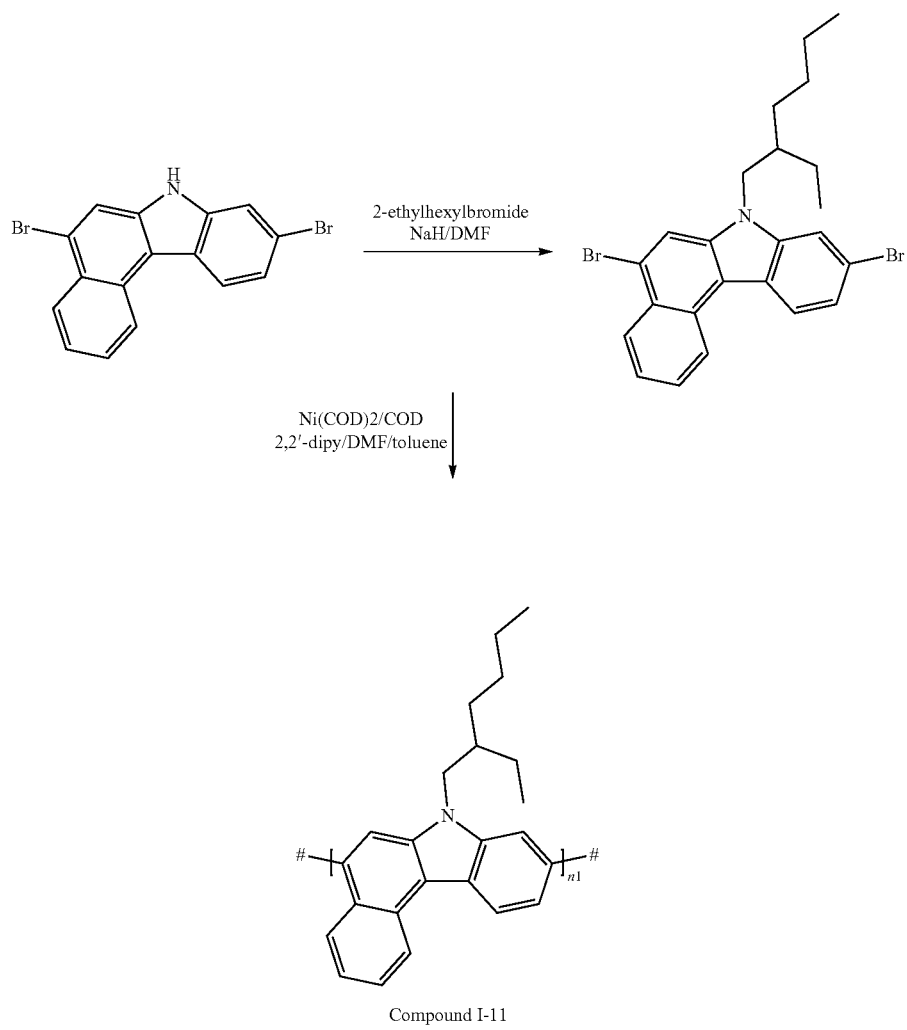
Compound I-11

Deuterated compounds can be prepared in a similar manner using deuterated precursor materials or, more generally, by treating the non-deuterated compound with deuterated solvent, such as benzene-d6, in the presence of a Lewis acid H/D exchange catalyst, such as trifluoromethanesulfonic acid, aluminum trichloride or ethyl aluminum dichloride.

Additional exemplary preparations are given in the Examples.

Some non-limiting examples of compounds having Formula I are shown below.

Compound I-1

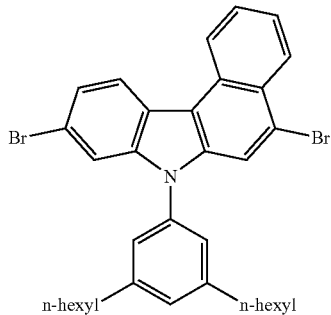

Compound I-2

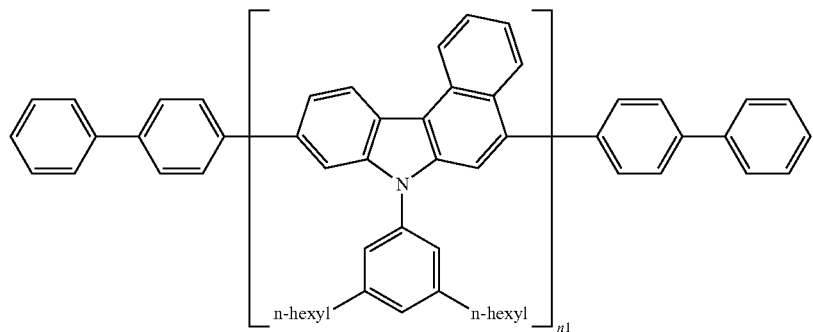

Compound I-3

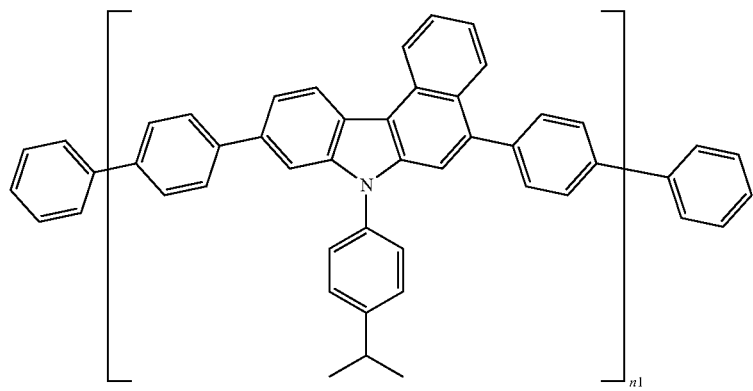

-continued
Compound I-4
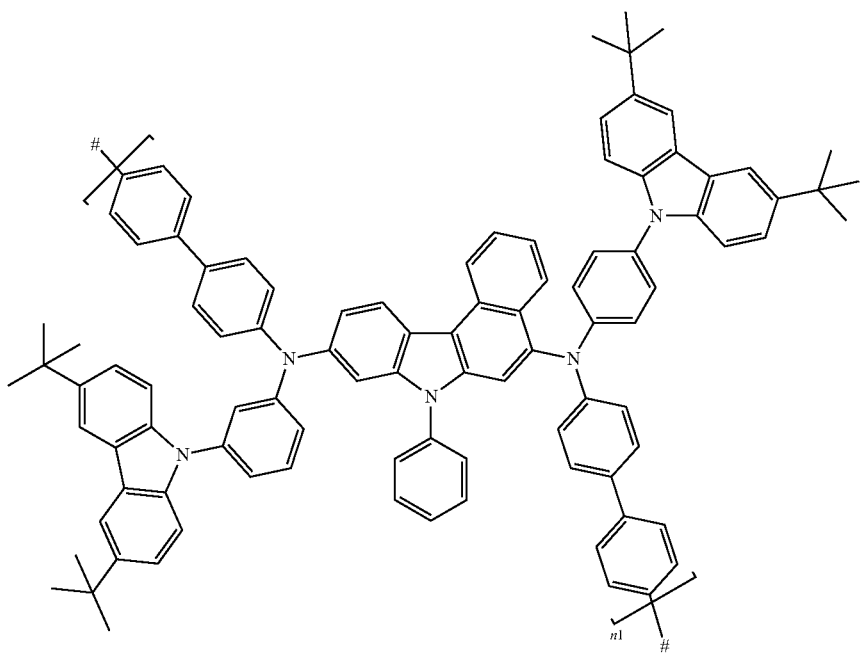
Compound I-5
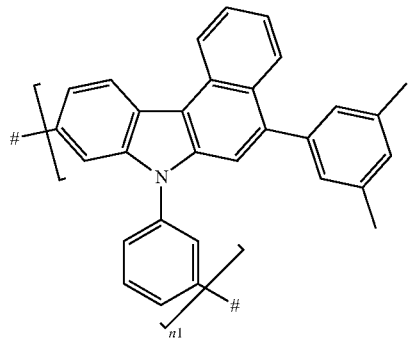
Compound I-6
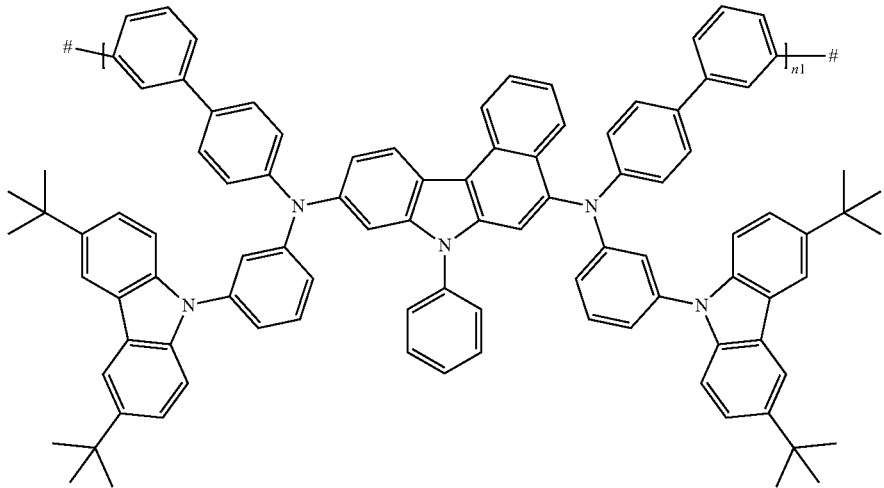

-continued
Compound I-7
Compound I-8
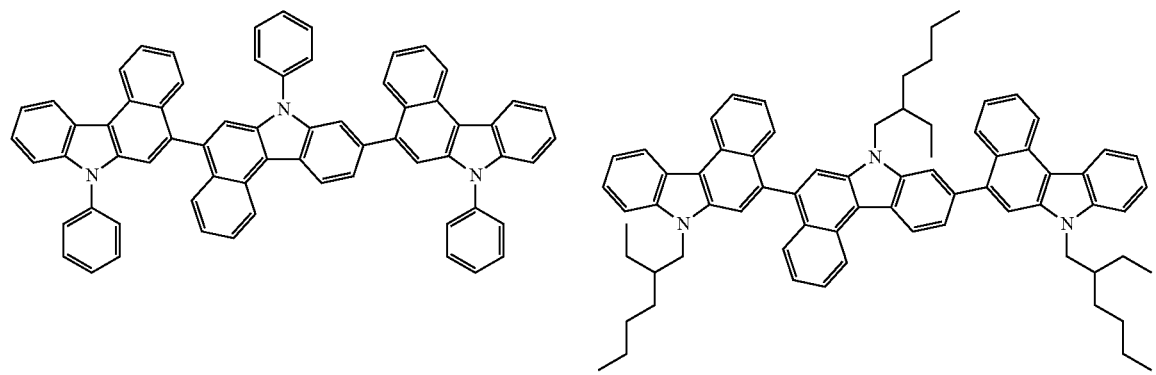
Compound I-9
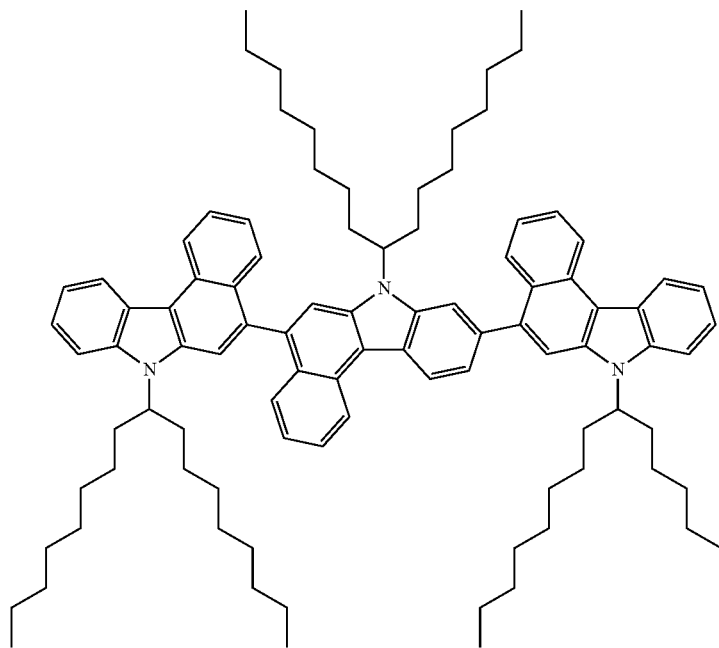
Compound I-10
Compound I-11
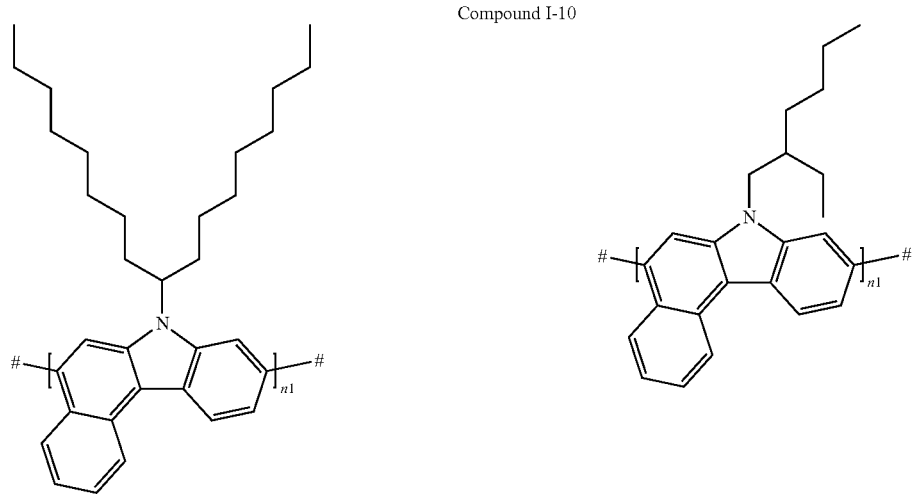

Compound I-12
Compound I-13
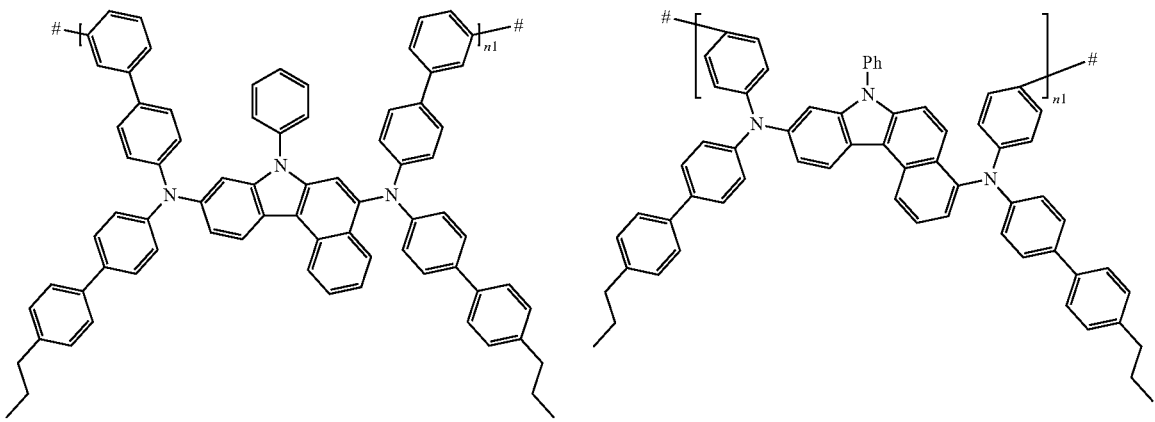
Compound I-14
Compound I-15
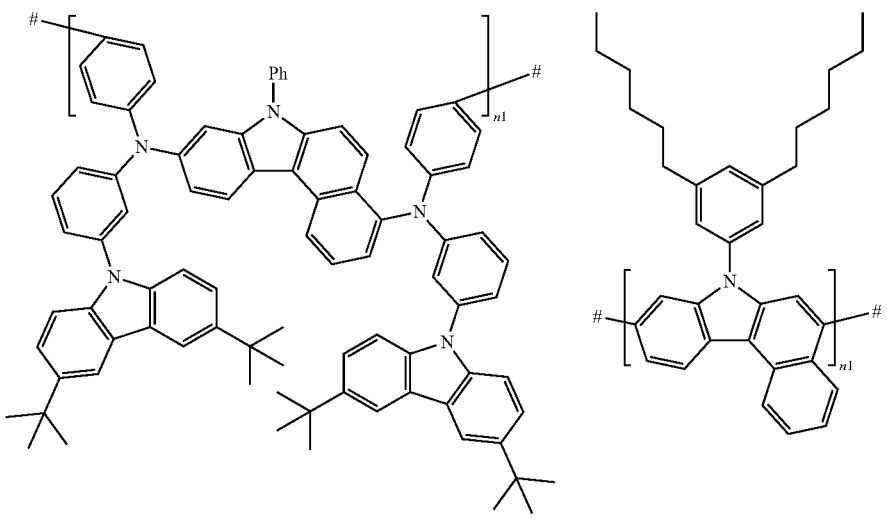
Compound I-16
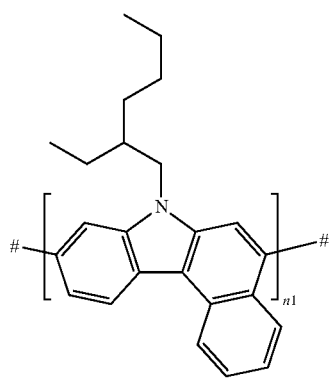

In the above compounds, n1 is an integer equal to or greater than 5 and # indicates a point of attachment. In some embodiments of the above compounds n1>10. In some embodiments of the above compounds, n1=5-500; in some embodiments, 10-300.

The compounds can be formed into layers for electronic devices.

3. Monomeric Unit Having Formula II and the Copolymer Having Formula III

There is also provided a monomeric unit having Formula II

  (II)

wherein:
BCz is a substituted or unsubstituted benzocarbazole unit;
$Q^1$ and $Q^2$ are the same or different and are selected from the group consisting of a single bond, alkyl, aryl, heteroaryl, diarylamino, triarylamino, deuterated alkyl, deuterated aryl, deuterated heteroaryl, deuterated diarylamino, and deuterated triarylamino; and
# indicates a point of attachment.

All of the above-described embodiments for BCz, $Q^1$, and $Q^2$ in Formula I apply equally to BCz, $Q^1$, and $Q^2$ in Formula II.

In some embodiments of Formula II, the monomeric unit has Formula II-a

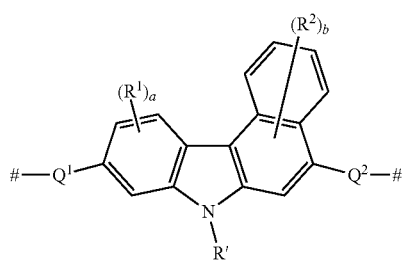  II-a where R', $R^1$, $R^2$, $Q^1$, $Q^2$, a and b are as defined above for Formula I-a, and # is a point of attachment.

In some embodiments of Formula II, the monomeric unit has Formula II-b

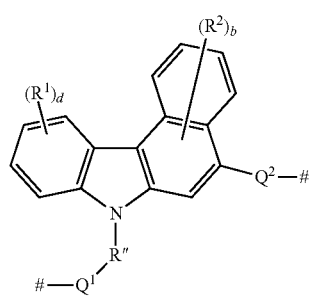  II-b where R", $R^1$, $R^2$, $Q^1$, $Q^2$, b and d are as defined above for Formula I-b, and # is a point of attachment.

In some embodiments of Formula II, the monomeric unit has Formula II-c

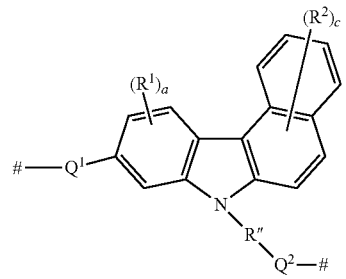  II-c where R", $R^1$, $R^2$, $Q^1$, $Q^2$, a and c are as defined above for Formula I-c, and # is a point of attachment.

In some embodiments, there is provided a polymer having at least one monomeric unit of Formula II, as described above.

In some embodiments, there is provided a polymer having at least one monomeric unit of Formula II-a, as described above.

In some embodiments, there is provided a polymer having at least one monomeric unit of Formula II-b, as described above.

In some embodiments, there is provided a polymer having at least one monomeric unit of Formula II-c, as described above.

All of the above-described embodiments for R', R", $L^1$, $L^2$, $R^1$, $R^2$, $Q^1$, $Q^2$, a, a b, c, d, and n in Formula I, apply equally to R', R", $L^1$, $L^2$, $R^1$, $R^2$, $Q^1$, $Q^2$, a, b, c, d, and n in Formula II-a, Formula II-b, and Formula II-c. Any of the above embodiments of Formula II, Formula II-a, Formula II-b, or Formula II-c can be combined with one or more of the other embodiments, so long as they are not mutually exclusive.

There is also provided a copolymer having Formula III

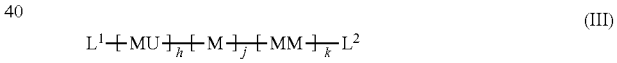  (III)

wherein:
MU is a monomeric unit having Formula II;
M and MM are different and are monomeric units;
$L^1$ and $L^2$ are the same or different and are selected from the group consisting of H, D, halogen, aryl, arylamino, crosslinkable groups, deuterated aryl, deuterated arylamino, and deuterated crosslinkable groups; and
h, j, and k are mole fractions such that h+j+k=1, where h and j are non-zero.

In some embodiments, the copolymers having Formula III are useful as emissive materials. In some embodiments, the copolymers are blue emissive materials. They can be used alone or as a dopant in a host material.

In some embodiments, the copolymers having Formula III are useful as hosts for emissive dopants.

In some embodiments, the copolymers of Formula III have a weight average molecular weight ("Mw") >20 kDa; in some embodiments, Mw>50 kDa. In some embodiments of Formula III, Mw=10-1000 kDa; in some embodiments, Mw=20-500 kDa; in some embodiments, Mw=20-200 kDa.

In Formula III, the "MU", "M", and "MM" units are all different. In some embodiments of Formula III, the "MU", "M", and "MM" units are ordered in a regular alternating pattern.

In some embodiments of Formula III, the "MU", "M", and "MM" units are ordered in blocks of like monomers.

In some embodiments of Formula III, the "MU", "M", and "MM" units are randomly arranged.

In some embodiments of Formula III, h is in the range of 0.50-0.99; in some embodiments, 0.6-0.90; in some embodiments, 0.75-0.85.

In some embodiments of Formula III, j is in the range of 0.01-0.50; in some embodiments, 0.1-0.4; in some embodiments, 0.2-0.3.

In some embodiments of Formula III, k is in the range of 0-0.4; in some embodiments 0.1-0.2.

In some embodiments of Formula III; the ranges for h, j, and k will depend upon the method of polymerization used to prepare the material.

All of the above-described embodiments for $L^1$ and $L^2$ in Formula I apply equally to $L^1$ and $L^2$ in Formula III.

In some embodiments of Formula III, M is a deuterated aromatic moiety.

In some embodiments of Formula III, M has Formula II, provided that M≠MU.

In some embodiments of Formula III, M is a monomeric unit derived from an olefin, an acetylenic compound, a styrene, a stilbene, a substituted derivative thereof, or a deuterated analog thereof.

In some embodiments of Formula III, M has Formula c as defined above.

In some embodiments of formula V, M has Formula d as defined above.

In some embodiments of Formula III, M is a monomeric unit derived from a hydrocarbon aryl having two or more fused rings or a deuterated analog thereof.

In some embodiments of Formula III, M is a monomeric unit derived from the group consisting of naphthalene, anthracene, fluorene, phenanthrene, triphenylene, substituted derivatives thereof, and deuterated analogs thereof.

In some embodiments of Formula III, M is a monomeric unit derived from a triarylamino group or deuterated analog thereof.

In some embodiments of Formula III, M is a monomeric unit derived from a heteroaromatic compound having at least one ring atom which is selected from the group consisting of N, O, and S.

In some embodiments of Formula III, M is a monomeric unit derived from an N-heteroaryl, as described above.

In some embodiments of Formula III, M is a monomeric unit derived from an S-heteroaryl selected form the group consisting of thiophene, benzothiophene, dibenzothiophene, substituted derivatives thereof, and deuterated analogs thereof.

In some embodiments of Formula III, M is a monomeric unit derived from an O-heteroaryl selected from the group consisting of furan, benzofuran, dibenzofuran, substituted derivatives thereof, and deuterated analogs thereof.

In some embodiments of Formula III, M is a monomeric unit derived from an N,O-heteroaryl selected from the group consisting of oxazole, benzoxazole, oxazine, phenoxazine, substituted derivatives thereof, and deuterated analogs thereof.

In some embodiments of Formula III, M is a monomeric unit derived from an N,S-heteroaryl selected from the group consisting of thiazole, benzothiazole, substituted derivatives thereof, and deuterated analogs thereof.

In some embodiments of Formula III, M has one of the formulae given below.

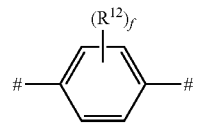

M1

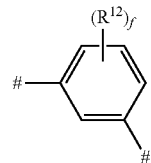

M2

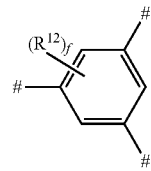

M2a

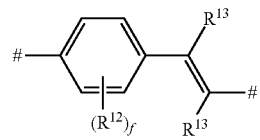

M3

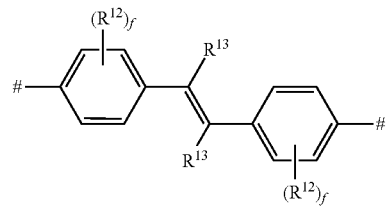

M4

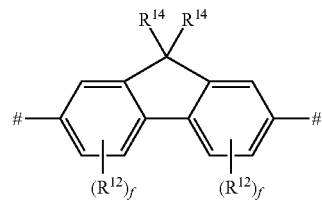

M5

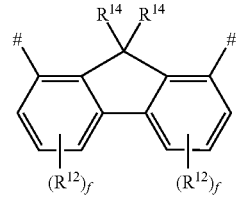

M6

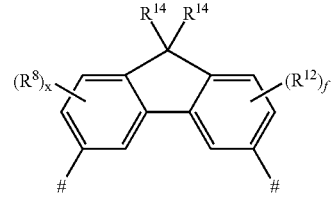

M7

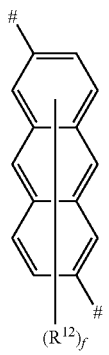
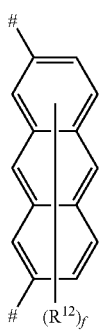
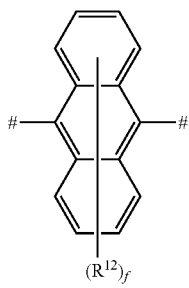
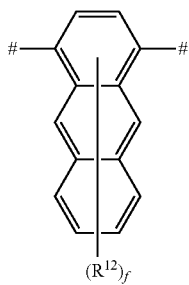
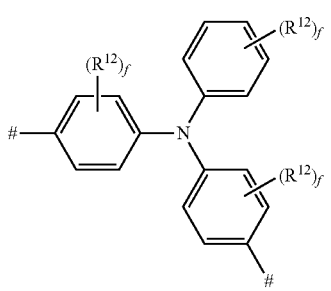
M8
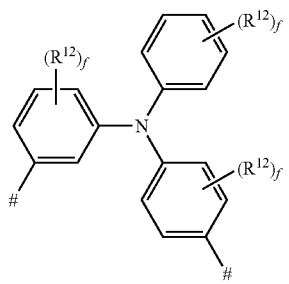
M8a
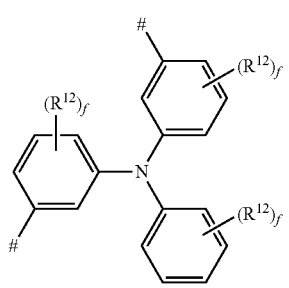
M9
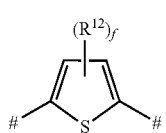
M9a
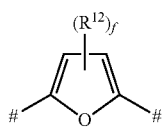
M10
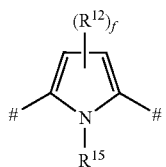
M11
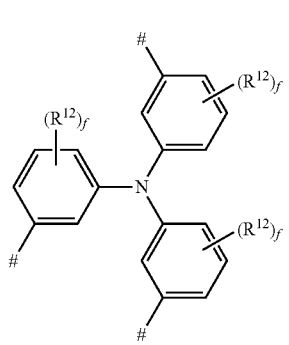
M12
M12a
M13
M14
M15

M16

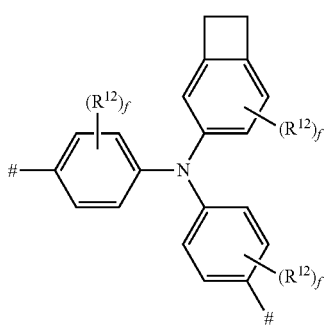

M17

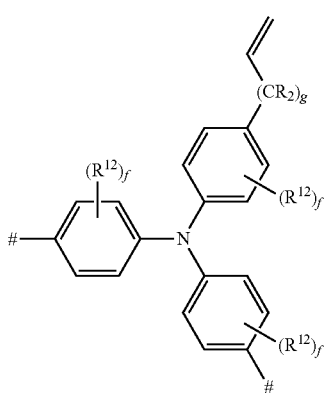

M18

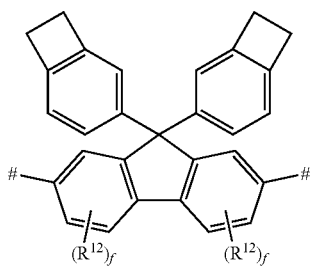

M19

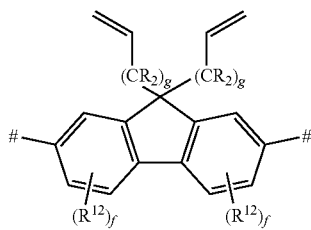

In M1 through M19:
R$^{12}$ is the same or different at each occurrence and is selected from the group consisting of D, alkyl, silyl, aryl, deuterated alkyl, deuterated silyl, and deuterated aryl;
R$^{13}$ is the same or different at each occurrence and is selected from the group consisting of H, D, alkyl, and deuterated alkyl;
R$^{14}$ is the same or different at each occurrence and is selected from the group consisting of alkyl, aryl, alkylaryl, alkyl having a point of attachment to the polymer, aryl having a point of attachment to the polymer, alkylaryl having a point of attachment to the polymer, and deuterated analogs thereof;
R$^{15}$ is the same or different at each occurrence and is selected from the group consisting of aryl and deuterated aryl;
f is the same or different at each occurrence and is an integer from 0 to the maximum number of positions available for substituents;
g is an integer of 0-20; and
# indicates a point of attachment.

In some embodiments of M1 through M19, f is 0-2.

All of the above-described embodiments for M apply equally to MM, provided that M≠MM.

In some embodiments of Formula III, M is selected from M1 through M15.

In some embodiments of Formula III, MM is selected from M16 through M19.

Any of the above embodiments for Formula III can be combined with one or more of the other embodiments, so long as they are not mutually exclusive.

The copolymer having Formula III can be made using known coupling techniques and polymerization techniques. For example, Compound III-5 (below) may be made as:

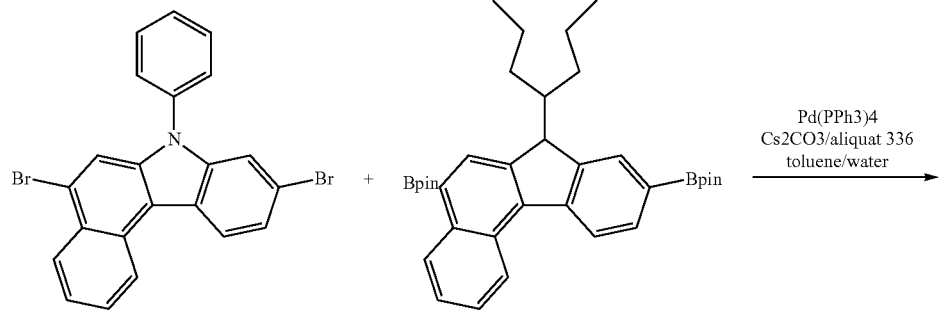

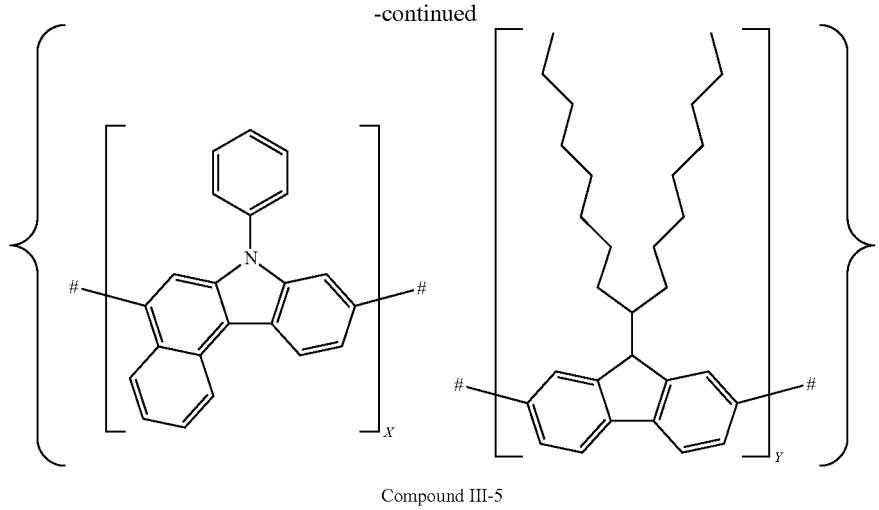
Compound III-5
where the values of x and y depend upon the type of polymerization reaction used in the synthesis.
Some non-limiting examples of copolymers having Formula III are shown below.
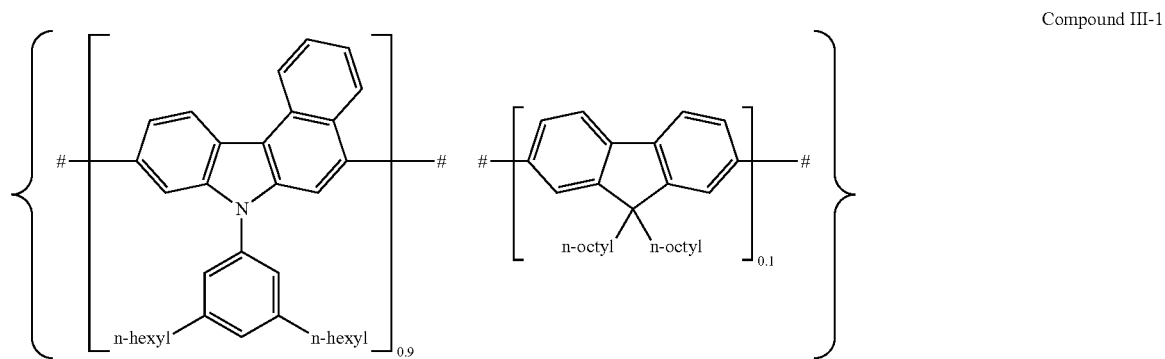
Compound III-1
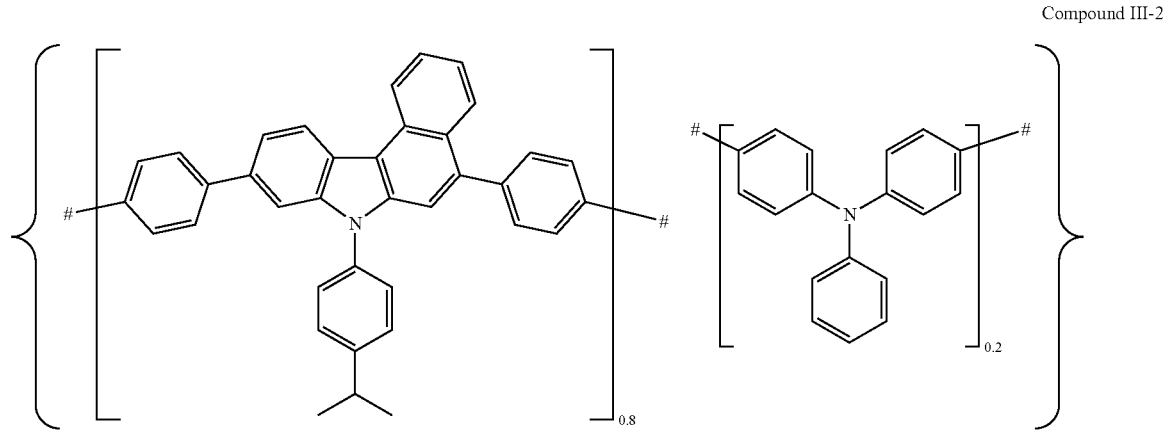
Compound III-2

Compound III-3

Compound III-4

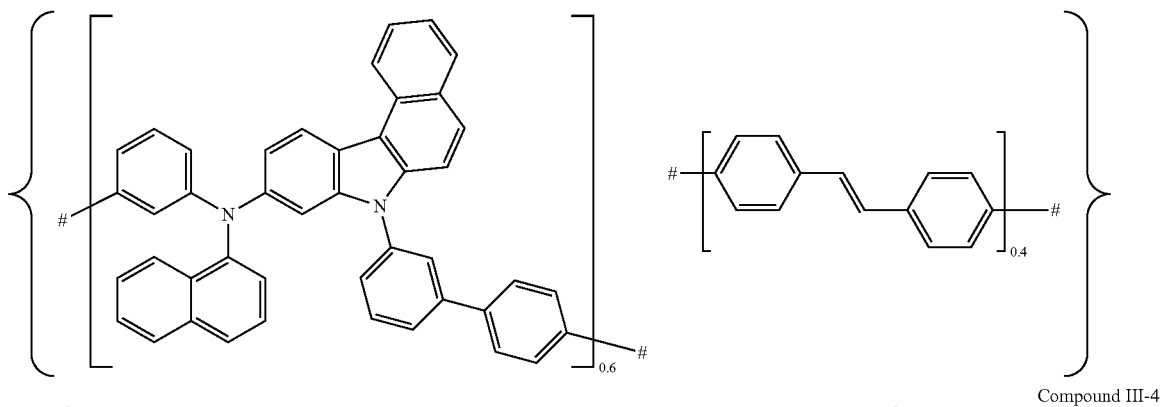

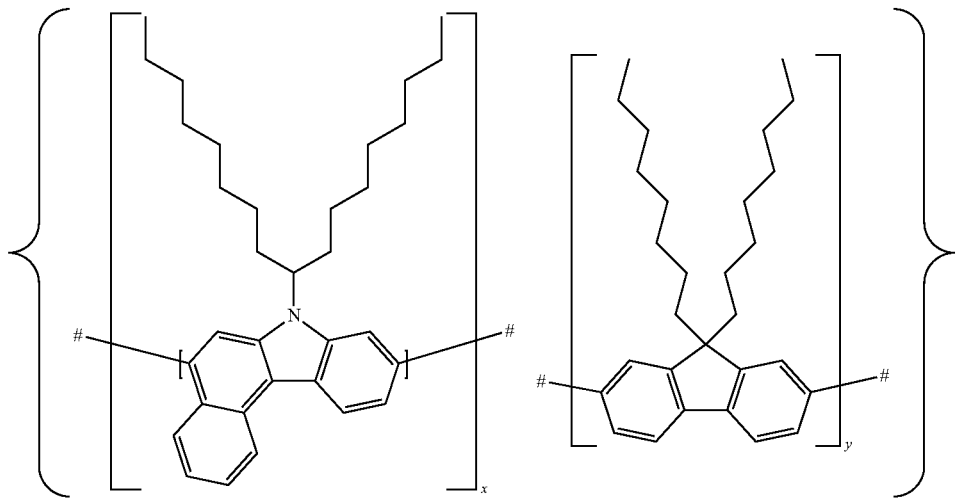

where the values of x and y depend upon the type of polymerization reaction used in the synthesis, and x+y=1. In some embodiments, x>0.5 and y>0.05. In some embodiments, x=0.5-0.95; in some embodiments, 0.6-0.9.

Compound III-5

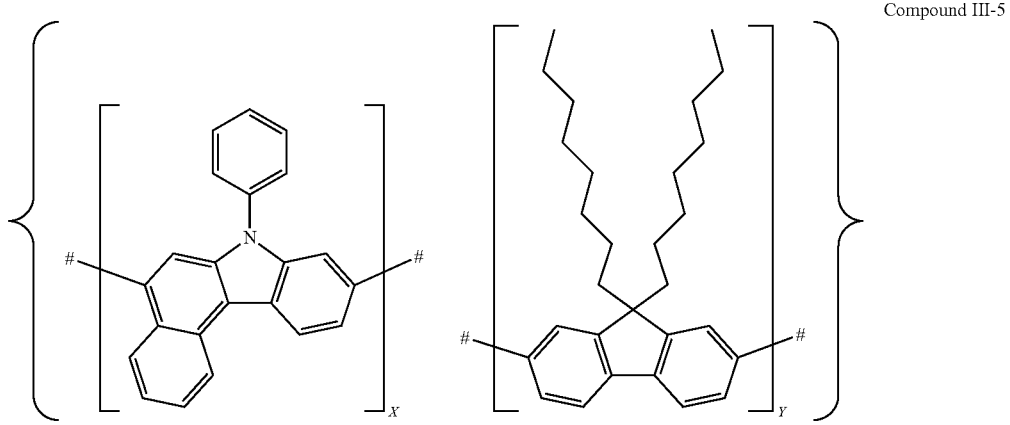

where the values of x and y depend upon the type of polymerization reaction used in the synthesis, and x+y=1. In some embodiments, x>0.5 and y>0.05. In some embodiments, x=0.5-0.95; in some embodiments, 0.6-0.9.

4. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a downconverting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure including the compound, polymer, or copolymer described herein is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
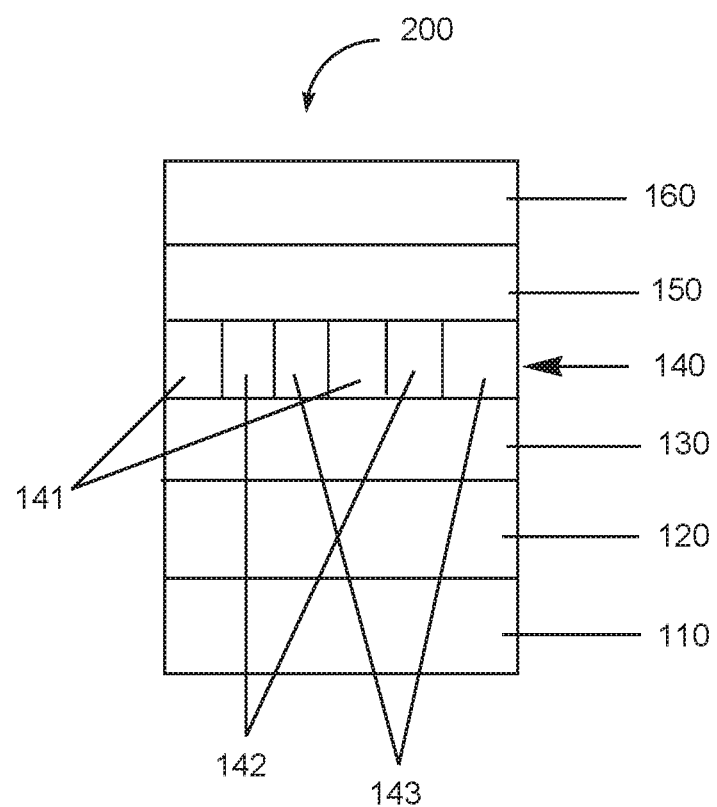
FIG. 2 includes an illustration of another example of an organic electronic device.

In some embodiments, in order to achieve full color, the light-emitting layer is pixellated, with subpixel units for each of the different colors. An illustration of a pixellated device is shown in FIG. 2. The device 200 has anode 110, hole injection layer 120, hole transport layer 130, photoactive layer 140, electron transport layer 150, and cathode 160. The photoactive layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new compounds having Formula I, copolymers having at least one monomeric unit of Formula II, or copolymers having Formula III described herein may be present in one or more of the electroactive layers of a device.

In some embodiments, the new compounds having Formula I, copolymers having at least one monomeric unit of Formula II, or copolymers having Formula III are useful as hole transport materials in hole transport layer 130.

In some embodiments, the new compounds having Formula I, copolymers having at least one monomeric unit of Formula II, or copolymers having Formula III are useful as photoactive materials in layer 140. In some embodiments, the new compounds having Formula I, copolymers having at least one monomeric unit of Formula II, or copolymers having Formula III are present as photoactive dopant materials in one or more host materials. The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material to which a dopant is added. The host material may or may not have electronic characteristic(s) or the ability to emit, receive, or filter radiation. In some embodiments, the host material is present in higher concentration.

In some embodiments, the new compounds having Formula I, copolymers having at least one monomeric unit of Formula II, or copolymers having Formula III are useful as host materials for photoactive dopant materials in photoactive layer 140.

In some embodiments, an organic electronic device includes an anode, a cathode, and at least one organic active layer therebetween, where the organic active layer includes one or more of the new compounds having Formula I, copolymers having at least one monomeric unit of Formula II, or copolymers having Formula III.

In some embodiments, an organic electronic device includes an anode, a cathode, and at least one organic active layer therebetween, where the organic active layer includes a compound having Formula I, copolymer having at least one monomeric unit of Formula II, or copolymer having Formula III. In some embodiments, the organic active layer is a hole transport layer. In some embodiments, the organic active layer is a photoactive layer.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material.

In some embodiments, layer 130 includes a compound having Formula I, copolymer having at least one monomeric unit of Formula II, or copolymer having Formula III. In some embodiments, layer 130 includes only a compound having Formula I, where additional materials that would materially alter the principle of operation or the distinguishing characteristics of the layer are not present.

In some embodiments, layer 130 includes other hole transport materials. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4, 4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); a-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and nitrogen-containing macrocyclic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes a compound having Formula I, copolymer having at least one monomeric unit of Formula II, or copolymer having Formula III as a host material for a photoactive dopant.

In some embodiments, photoactive layer 140 includes only a compound having Formula I, copolymer having at least one monomeric unit of Formula II, or copolymer having Formula III, and a photoactive dopant, where additional materials that would materially alter the principle of operation or the distinguishing characteristics of the layer are not present.

In some embodiments, the photoactive layer 140 includes a compound having Formula I, copolymer having at least one monomeric unit of Formula II, or copolymer having Formula III as a photoactive material and further comprises a host material.

Examples of host materials include, but are not limited to, chrysenes, phenanthrenes, triphenylenes, phenanthrolines, naphthalenes, anthracenes, quinolines, isoquinolines, quinoxalines, phenylpyridines, indolocarbazoles, indoloindoles, furans, benzofurans, dibenzofurans, benzodifurans, and metal quinolinate complexes. In some embodiments, the host materials are deuterated.

In some embodiments, the photoactive layer 140 includes only a compound having Formula I, copolymer having at least one monomeric unit of Formula II, or copolymer having Formula III as a photoactive material and a host material, where additional materials that would materially alter the principle of operation or the distinguishing characteristics of the layer are not present.

When the electroactive materials described herein are used as host materials, the photoactive dopant can be an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In some embodiments, the photoactive layer further includes a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, indolocarbazoles, furans, benzofurans, dibenzofurans, benzodifurans, and metal quinolinate complexes.

Optional layer 150 can function both to facilitate electron transport, and also serve as a confinement layer to prevent quenching of the exciton at layer interfaces. Preferably, this layer promotes electron mobility and reduces exciton quenching.

In some embodiments, layer 150 includes other electron transport materials. Examples of electron transport materials which can be used in the optional electron transport layer 150, include metal chelated oxinoid compounds, including metal quinolate derivatives such as tris(8-hydroxyquinolato) aluminum (AlQ), bis(2-methyl-8-quinolinolato)(p-phenylphenolato) aluminum (BAlq), tetrakis-(8-hydroxyquinolato) hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof. In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, including the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), ketones (cyclopentatone) and mixtures thereof. Suitable solvents for electroluminescent materials have been described in, for example, published PCT application WO 2007/145979.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

In the synthesis examples, the following abbreviations are used:
COD=1,5-cyclooctadiene
dba=dibenzylideneacetone
2,2'-dipy=2,2'dipyridyl
DMA=dimethylacetamide
dppf=1,1"-bis(diphenylphosphino)ferrocene Synthesis Example 1

This example illustrates the synthesis of a polymer having Formula I, Compound 1-6, with three different molecular weights.

Part 1. Monomer (a) N-(3-aminophenyl)-2,6,-di-tert-butyl-carbazole

A solution of 1M LiN(SiMe$_3$)$_2$ in toluene (26.6 ml, 26.6 mmole) was added to a stirred solution of N-(3-bromophenyl)2,6-di-tert-butylcarbazole (10.5 g, 24.2 mmole), Pd$_2$(dba)$_3$ (0.443 g, 0.48 mmole), tri-tert-butyl-phosphine (0.195 g, 0.97 mmole) in dry toluene (150 ml) under nitrogen atmosphere. The resulting mixture was stirred at room temperature for 5 min and then heated to 80° C. overnight until completion by TLC/UPLC. The reaction mixture was cooled down to ambient temperature, water (0.5 ml) carefully added dropwise to quench excess of LiN(SiMe$_3$)$_2$ and the reaction mixture was stirred in the air for 1 min. After that reaction mixture passed through layers of celite, florisil and silica gel washing with toluene (100 mL). Concentrated hydrochloric acid (10 ml) added at once to this solution and the mixture stirred for 30 min at room temperature. Precipitate filtered, washed with methanol and dried to afford hydrochloric salt of N-(3-aminophenyl)-2,6,-di-tert-butyl-carbazole. This salt was converted to free amine by stirring a suspension of the above salt in dichloromethane and 40% aq. KOH, collecting organic phase, drying it over sodium sulfate and evaporating solvent by using rotary evaporator. Yield, 6.62 g (17.9 mmole, 67%). $^1$H-NMR (CDCl$_3$, 500 MHz): 1.47 (s, 18H), 6.74 (ddd, 1H, J=8, 2, 1 Hz), 6.87 (t, 1H, J=2 Hz), 6.95 (ddd, 1H, J=8, 2, 1 Hz), 7.34 (t, 1H, J=8 Hz), 7.40 (d, 2H, J=8.5 Hz), 7.46 (dd, 2H, J=8.5, 2 Hz), 8.13 (d, 2H, J=1.5 Hz). MS: MH+=372.

(b) N$^5$,N$^9$-bis(N-3-(2,6-di-tert-butylcarbazolyl)phenyl-7-phenyl-7H-benzo[c]carbazole-5,9-diamine 5,9-dibromo-7-phenyl-7H-benzo[c]carbazole (5.0 g, 11.1 mmole), N-(3-aminophenyl)-2,6-di-tert-butylcarbazole (8.63 g, 23.3 mmole), Pd$_2$(dba)$_3$ (0.305 g, 0.33 mmole), tri-tert-butyl-phosphine (0.134 g, 0.66 mmole) and toluene (80 ml) were added to round bottom reaction flask at room temperature under nitrogen atmosphere. After that sodium tert-butoxide (2.34 g, 24.4 mmole) was added to the mixture and the resulting suspension stirred for 15 hours. After that water (16 ml) added to the mixture and resulting suspension stirred in the air for 30 min. Organic layer was separated, dried over anhydrous sodium sulfate and filtered. The filtrate passed through a filter filled with layers of celite, florisil and silica gel washing with toluene. Solvent was removed on rotary evaporator, the residue was redissolved in dichloromethane, evaporated onto celite and subjected to separation on silica gel column using mixtures of hexanes and dichloromethane as eluent. Fractions containing the product combined, eluent evaporated and the residue dried under vacuum to give 7.9 g (7.67 mmol, yield—69%) of N$^5$,N$^9$-bis(N-3-(2,6-di-tert-butylcarbazolyl)phenyl-7-phenyl-7H-benzo[c]carbazole-5,9-diamine with purity 99.2% by UPLC. MS: MH+=1031. UV-vis (acetonitrile-water): $\lambda_{max}$=389 nm.

(c) N$^5$,N$^9$-bis(N-3-(2,6-di-tert-butylcarbazolyl)phenyl-N$^5$,N$^9$-bis(3'-bromobiphenyl)-7-phenyl-7H-benzo[c]carbazole-5,9-diamine N$^5$,N$^9$-bis(N-3-(2,6-di-tert-butylcarbazolyl)phenyl-7-phenyl-7H-benzo[c]carbazole-5,9-diamine (2.0 g, 1.94 mmole), 3-bromo-4-iodobiphenyl (2.09 g, 5.82 mmole) and toluene (46 ml) were added to round bottom reaction flask at room temperature under nitrogen atmosphere followed by premixed in 2 ml of toluene Pd$_2$(dba)$_3$ (0.017 g, 0.019 mmole), 1,1'-bis(diphenylphosphino)ferrocene (0.021 g, 0.038 mmole). After that sodium tert-butoxide (0.56 g, 5.82 mmole) was added to the mixture and the resulting suspension stirred at 78° C. for 1 hour and then at 109° C. overnight monitoring the progress of the reaction by TLC/UPLC. The reaction mixture was cooled down to ambient temperature, water (10 ml) added and the mixture was stirred in the air for 40 min. After that organic layer was separated, aqueous phase extracted with toluene and combined organic phase dried over sodium sulfate. Solvent was removed on rotary evaporator, the residue was redissolved in dichloromethane, evaporated onto celite and subjected to separation on silica gel column using mixtures of hexanes and dichloromethane as eluent to give 1.03 g of the product with purity 96.4% by UPLC and 1.43 g of the product with purity 98.4% by UPLC. Combined yield of N$^5$,N$^9$-bis(N-3-(2,6-di-tert-butylcarbazolyl)phenyl-N$^5$,N$^9$-bis(3'-bromobiphenyl)-7-phenyl-7H-benzo[c]carbazole-5,9-diamine, 2.46 g (1.65 mmole, 85%). MS: MH+=1493.

Part 2. Oligomer and Polymer

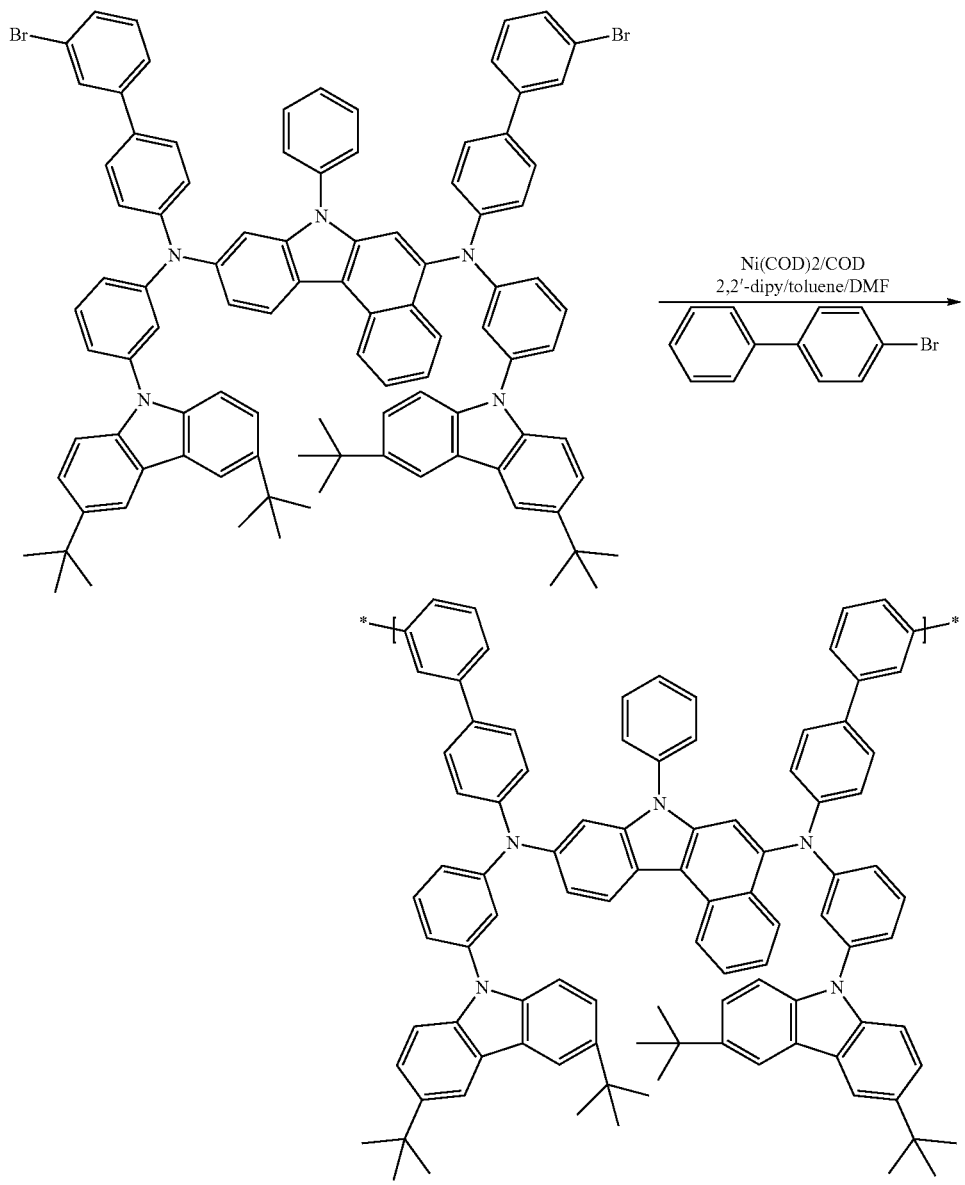

A mixture of bis-(1,5-cyclooctadiene)nickel (0.358 g, 1.3 mmol), 2,2'-dipyridyl (0.203 g, 1.3 mmol) and 1,5-cyclooctadiene (0.140 g, 1.3 mmol) in toluene (11.6 ml) and dimethylformamide (11.6 ml) was stirred at 60° C. for 45 minutes under nitrogen atmosphere in a glovebox. After that a solution of benzocarbazole monomer from step (a) (0.948 g, 0.635 mmol, 98.4% purity by UPLC) and 4-bromobiphenyl (1.5 mg) in anhydrous toluene (11.6 ml) was added at once and the reaction mixture was stirred at 60° C. for 3 hours. After that reaction mixture was cooled to 50C, transferred to fumehood and poured into methanol (300 ml) containing conc. hydrochloric acid (15 ml) and stirred for 30 min. Precipitate filtered, washed with methanol, dried, then dissolved in toluene (20 ml) and passed through a column filled with layers of silica gel (10 g) and basic alumina (10 g) eluating with toluene (30 ml). Toluene was evaporated using rotary evaporator to a volume approx. 3 ml. Additional amount of toluene (10 ml) was added to the concentrated solution and stirred on rotovap until formation of clear solution. Acetone (20 ml) was added portion-wise with stirring to this solution and the resulting suspension left to stand overnight under nitrogen undisturbed. Solvent mixtures decanted, solid residue redissolved in toluene and precipitated into methanol to give after drying in vacuum 40 mg of high molecular weight portion of polybenzocarbazole (Mw by GPC in THF: 89 kDa, PDI –1.56; UV-vis (toluene): $\lambda_{max}$, 409 nm, $\varepsilon$=42300; fluorescence (toluene): $\lambda_{max}$=444 nm, full width at half maxima (fwhm)=54 nm).

Decanted solvent mixture was placed into a flask and additional amount of acetone (20 ml) was added, the second precipitate collected again by decanting solvent mixtures after standing overnight under nitrogen atmosphere, redissolved in toluene, precipitated into methanol and dried in vacuum to give 72 mg of polybenzocarbazole with Mw=43 kDa and PDI=1.74 by GPC in THF (UV-vis (toluene): $\lambda_{max}$=407 nm, $\varepsilon$=42400; fluorescence (toluene): $\lambda_{max}$=444 nm, full width at half maxima (fwhm)=54 nm).

Finally, decanted solvent mixture was evaporated using rotary evaporator, the residue redissolved into toluene and precipitated into methanol to give after drying in vacuum 320 mg of oligomeric fraction of oligo-benzocarbazoles (GPC in THF: Mw=6 kDa, PDI=1.76; UV-vis (toluene): $\lambda_{max}$=406 nm, ε=45400; 444 nm, full width at half maxima (fwhm)=54 nm).

Comparative Compound A can be made in a manner analogous to the monomer of Synthesis Example 1, as shown below:

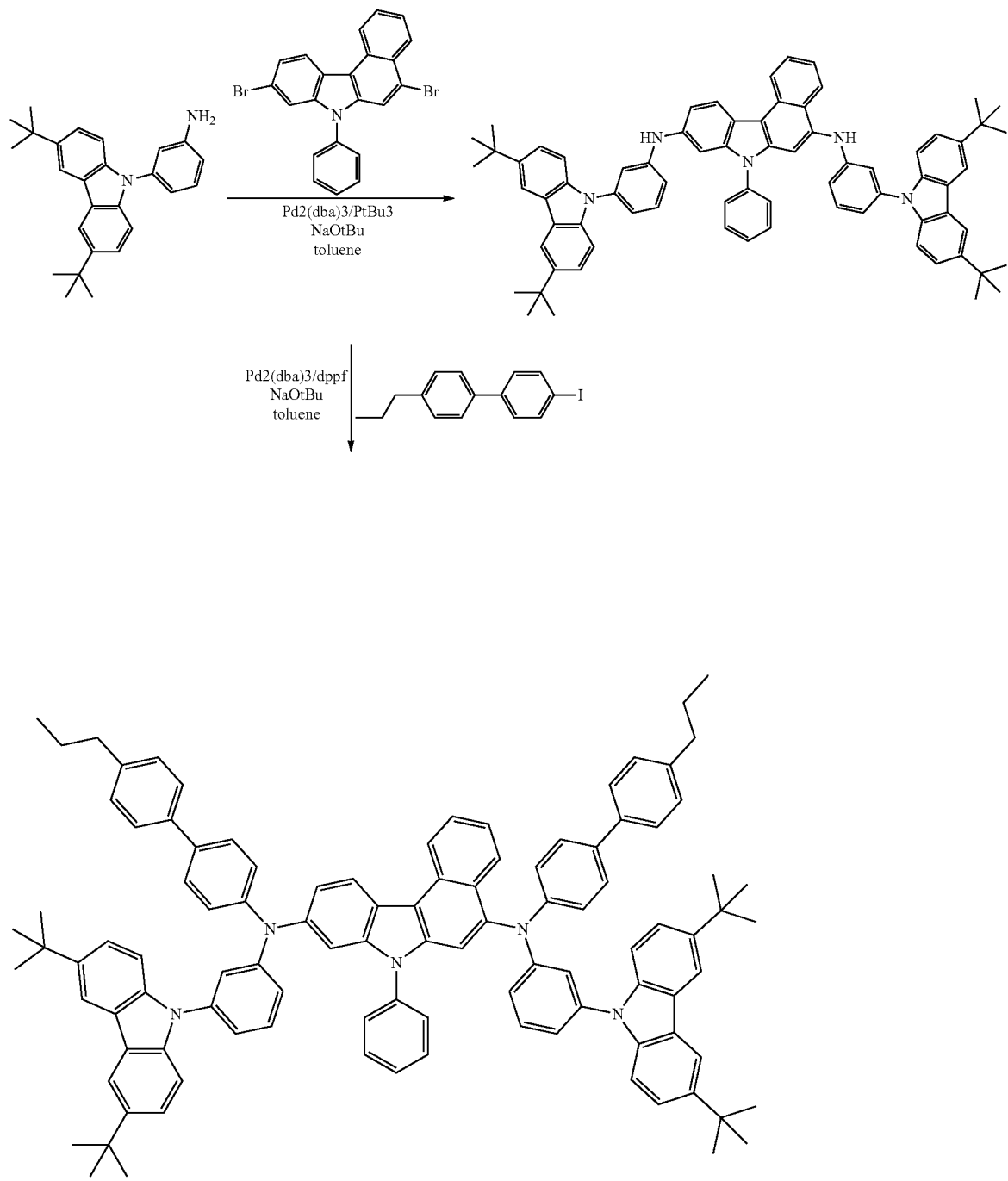

Comparative Compound A

Synthesis Example 2

This example illustrates the synthesis of a polymer having Formula I, Compound I-2.

Compound I-2 can be made as shown below:

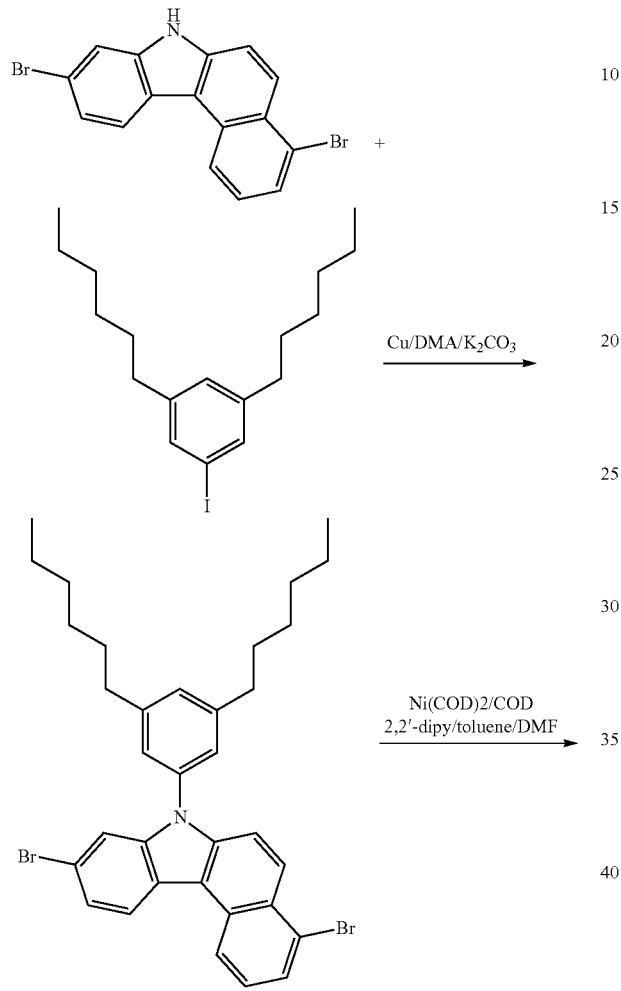

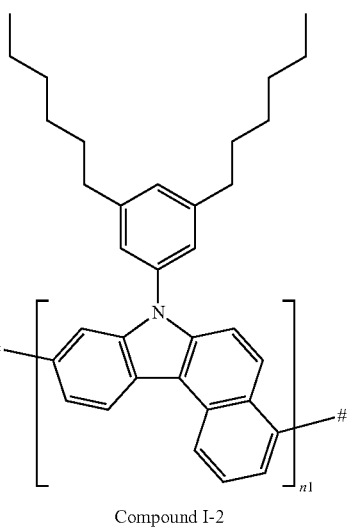

Compound I-2

The first reaction step may be carried out using copper salts, such as CuBr, CuI, or $Cu_2O$.

Synthesis Example 3

This example illustrates the synthesis of a polymer having Formula I, Compound I-12.

Compound I-12 can be made in a manner analogous to Synthesis Example 1, as shown below:

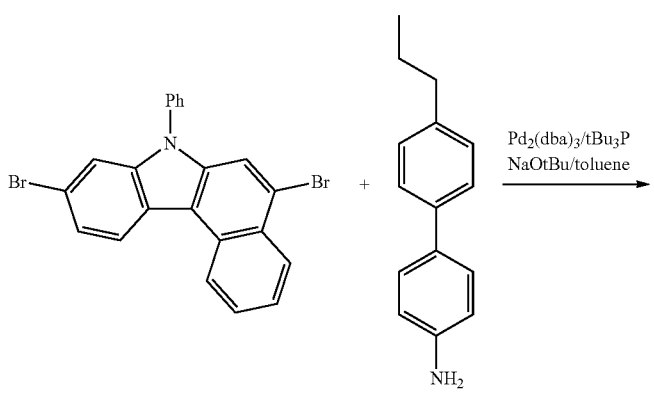

-continued
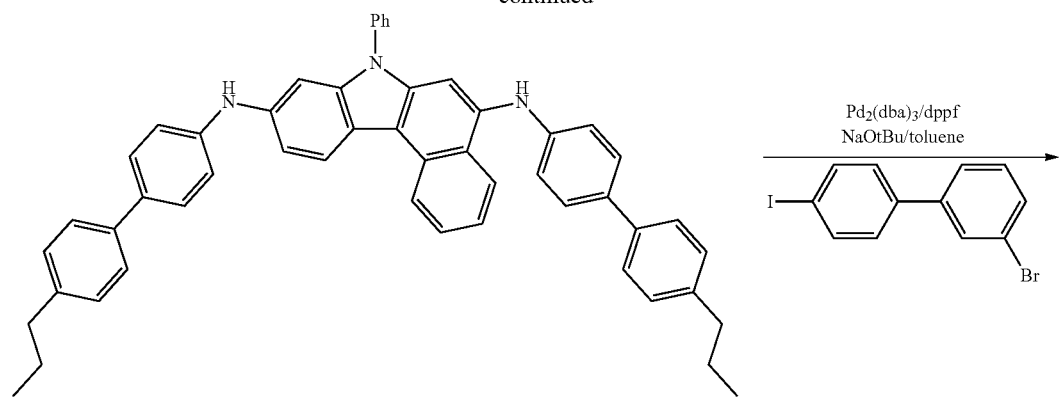
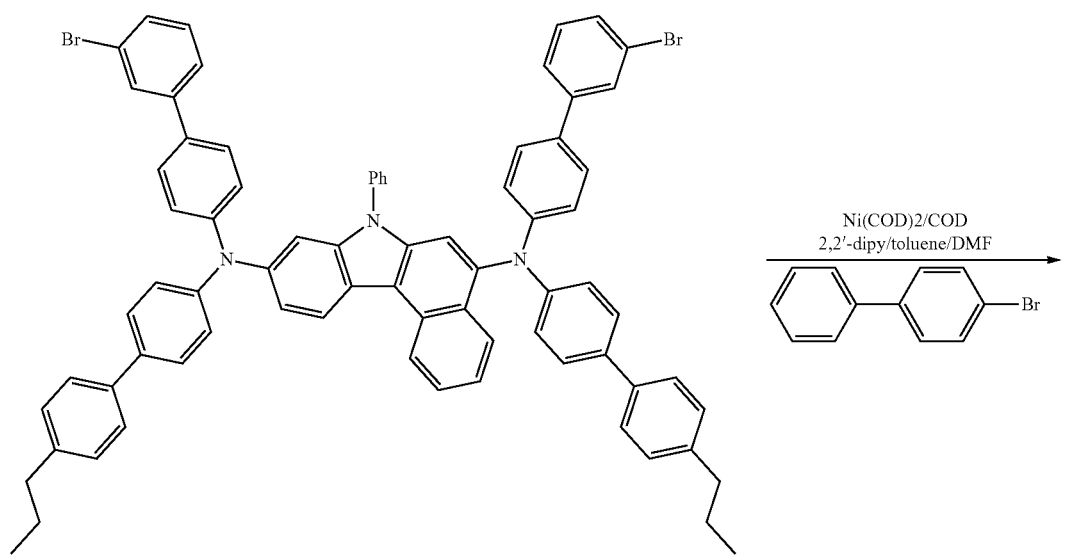
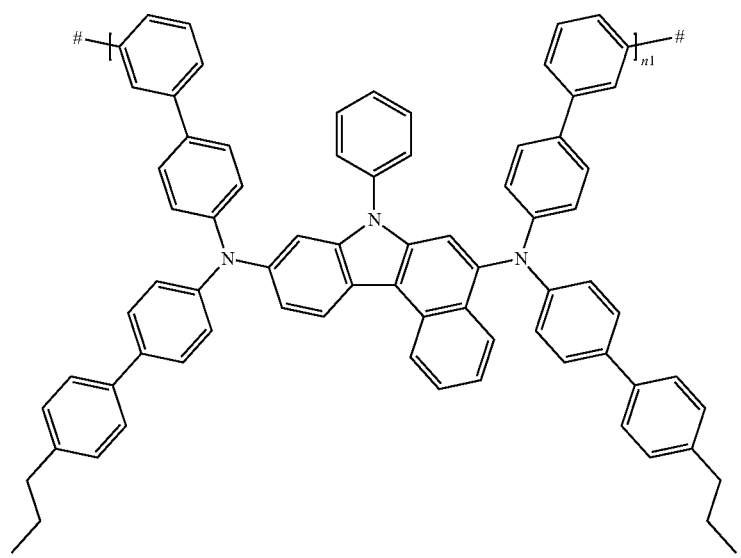
Compound I-12

Synthesis Example 4
This example illustrates the synthesis of a polymer having Formula I, Compound I-13.
Compound I-13 can be made in a manner analogous to Synthesis Example 1, as shown below:
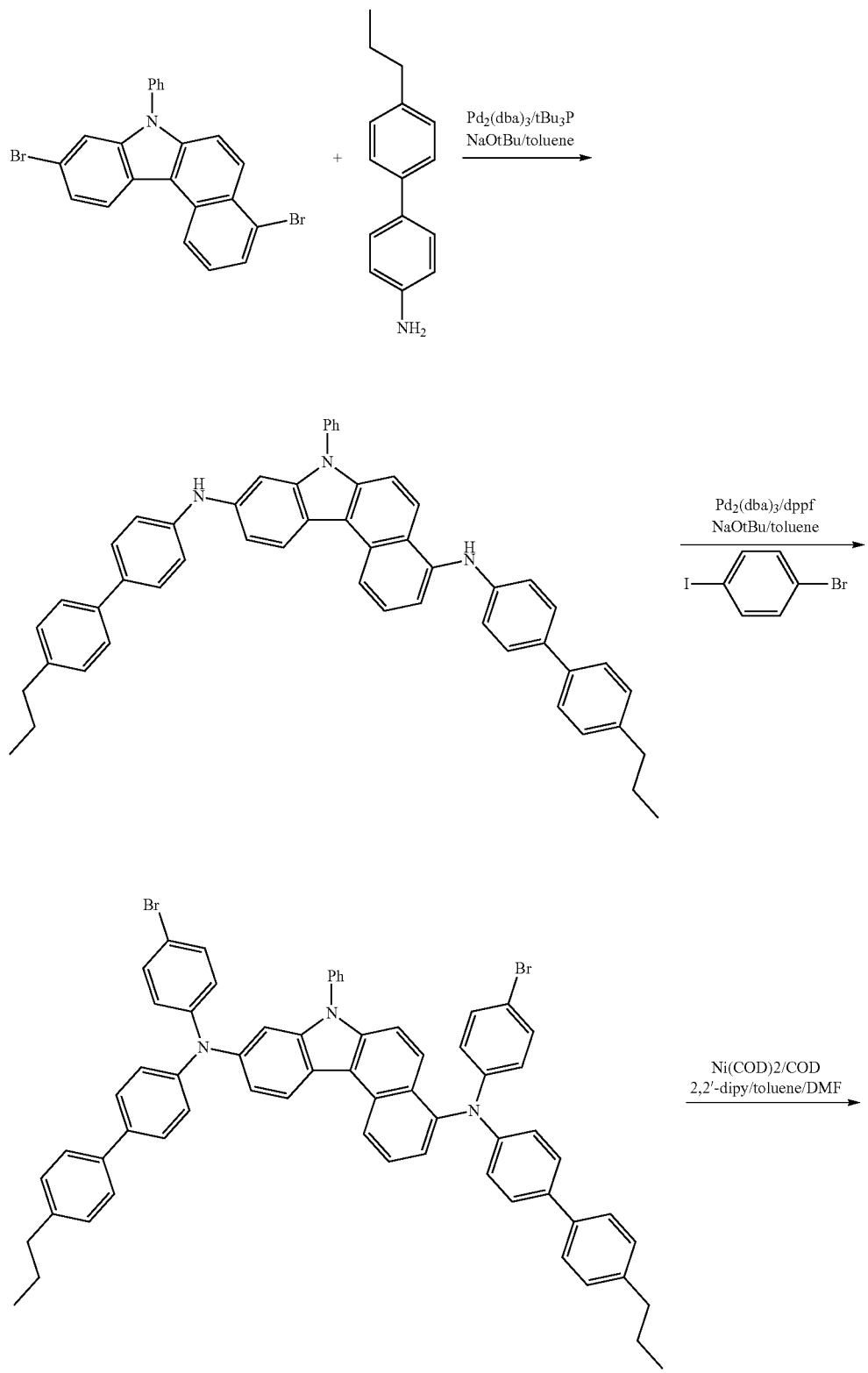

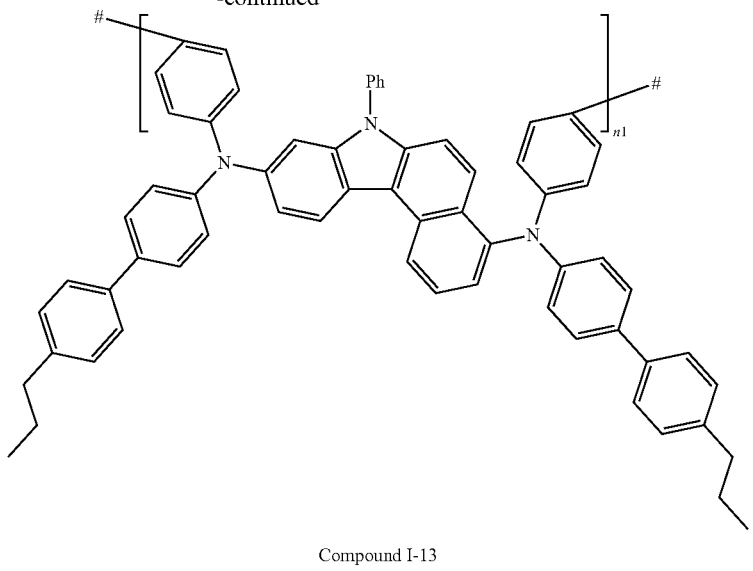
Compound I-13
Synthesis Example 5
This example illustrates the synthesis of a polymer having Formula I, Compound I-14.
Compound I-14 can be made in a manner analogous to Synthesis Example 1, as shown below:
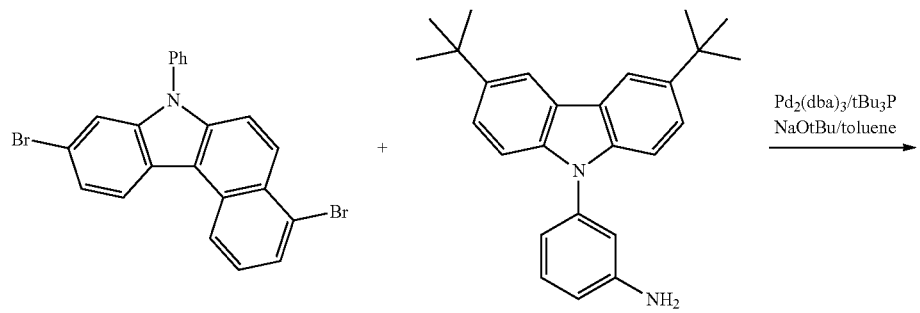
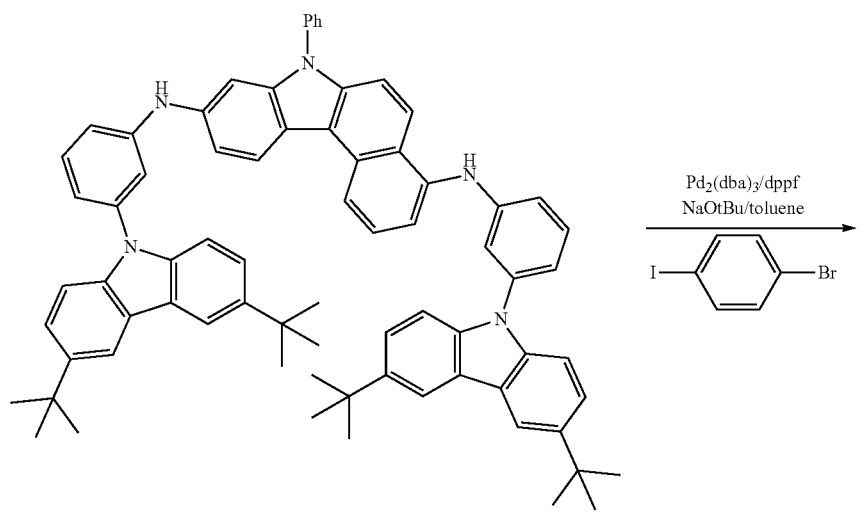

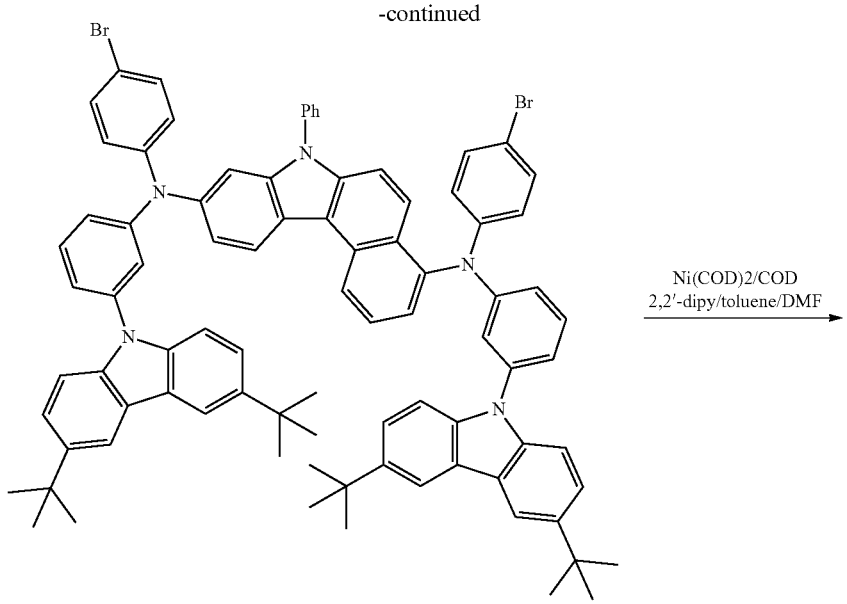
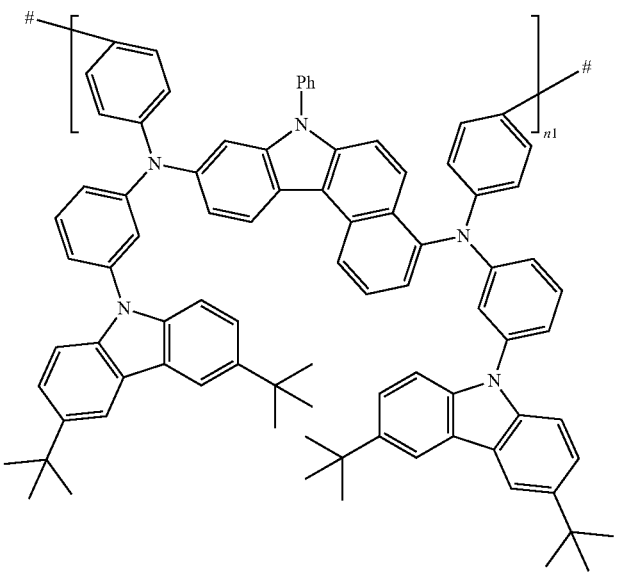
Compound I-14
Synthesis Example 6
This example illustrates the synthesis of a polymer having Formula I, Compound I-15.
Compound I-15 can be made as shown below:
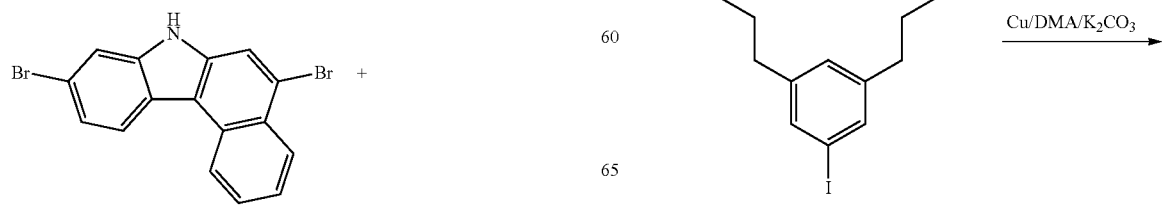

-continued

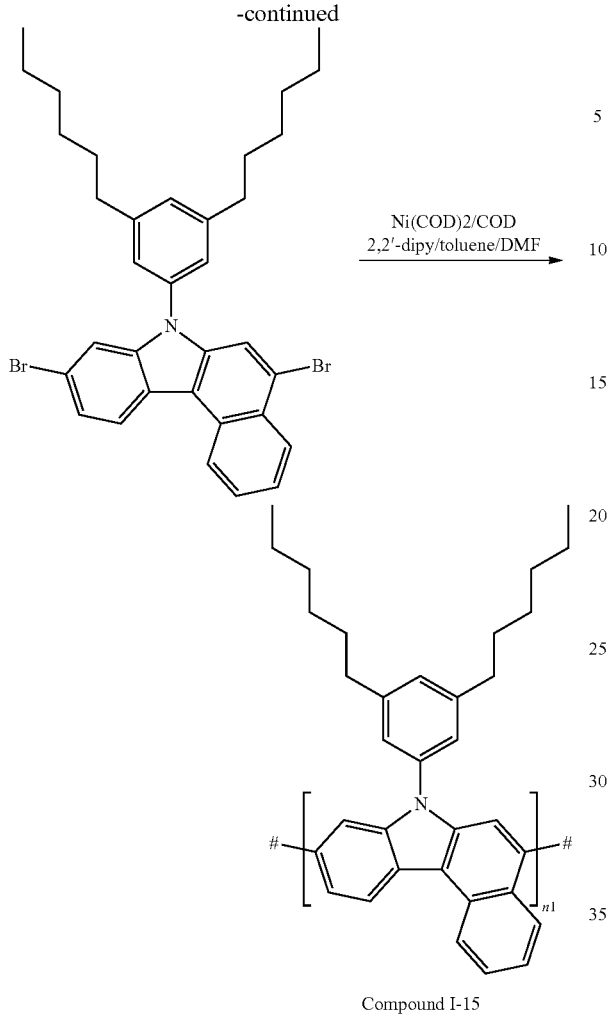

Compound I-15

The first reaction step may be carried out using copper salts, such as CuBr, CuI, or $Cu_2O$.

Synthesis Example 7

This example illustrates the synthesis of a polymer having Formula I, Compound I-16.

Compound I-16 can be made as shown below:

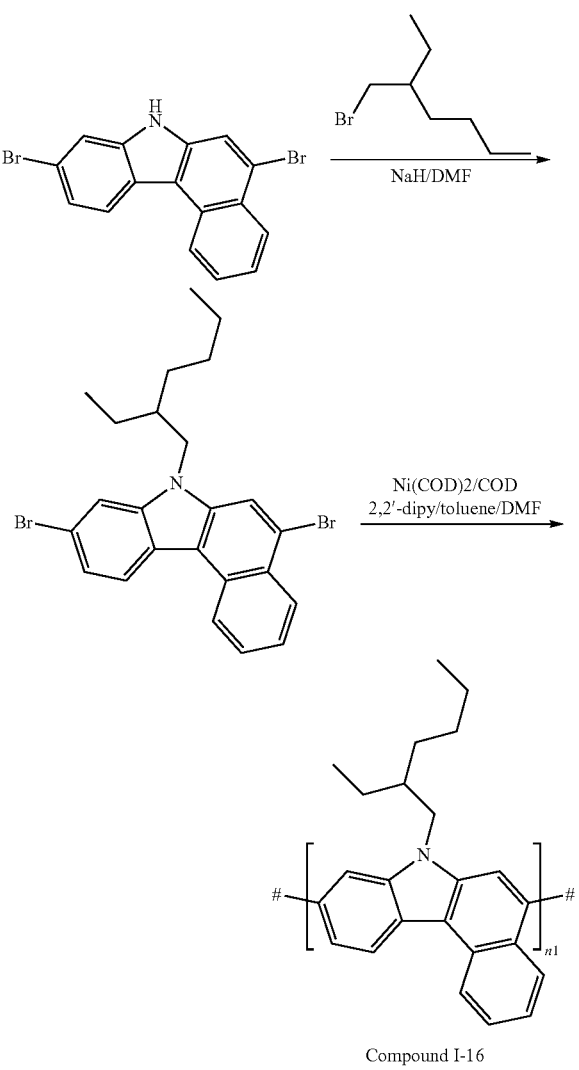

Compound I-16

Example 1 and Comparative Example A

This example illustrates the determination of the molecular orientation of a compound of the invention.
Materials:

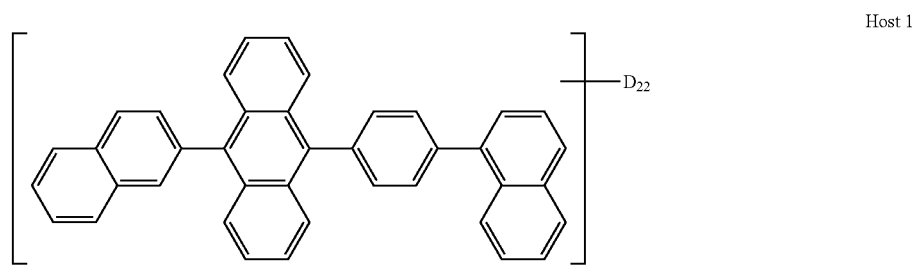

Host 1

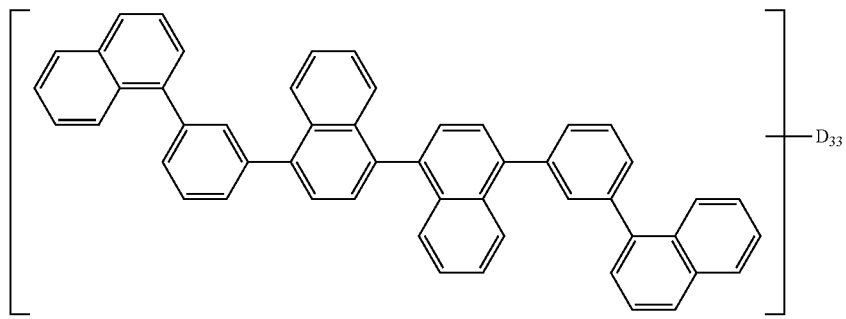

A solution of the emissive material to be tested and Host 1 was deposited onto a glass substrate, to a thickness of about 25 nm. The coated substrate was then placed in a vacuum chamber and a 70 nm thick capping layer of Host 2 was deposited by thermal evaporation. The chamber was vented, and the samples were encapsulated under a nitrogen environment using a glass lid, dessicant, and UV curable epoxy.

A 375 nm laser diode incident under 45° was used as the excitation source. The angular dependent PL spectrum from 0° to 90° was measured with a fiber optical spectrometer. Numerical simulations of the spectra were done for a range of dipole orientation, from 60% horizontal orientation to 100% pure horizontal orientation. Completely random orientation (isotropic) is 67% (⅔) horizontal.

The experimental results were compared to the numerical simulations to determine the % horizontal orientation in the test sample. The results are given in Table 1.

TABLE 1

| Orientation results | | |
|---|---|---|
| Example | Emissive Material | % Horizontal Orientation |
| Example 1 | Compound I-6, 89 kDa | 73 |
| Comparative A | Comparative Comp. A | 67 |

It can be seen from the data in Table 1, that the polymer Compound I-6 has a higher horizontal orientation percentage, while the small molecule Comparative Compound A, is nearly isotropic. This will result in higher efficiency for Compound I-6.

Example 2

This example illustrates how a compound of the invention could be used in an electronic device.

OLED devices may be fabricated by a combination of solution processing and thermal evaporation techniques. Patterned indium tin oxide (ITO) coated glass substrates may be used. The patterned ITO substrates may be cleaned ultrasonically in aqueous detergent solution and rinsed with distilled water. The patterned ITO may be subsequently cleaned ultrasonically in acetone, rinsed with isopropanol, and dried in a stream of nitrogen.

The cleaned, patterned ITO substrates may be treated with UV ozone for 10 minutes. Immediately after cooling, an aqueous dispersion of hole injection material may be spin-coated over the ITO surface and heated to remove solvent, to form the hole injection layer ("HIL"). After cooling, the substrates may then be spin-coated with a solution of hole transport material in a solvent, and then heated to remove solvent, to form the hole transport layer ("HTL"). After cooling the substrates may be spin-coated with a methyl benzoate solution of a diarylanthracene host and Compound I-6 as a dopant, and heated to remove solvent to form the photoactive layer or emissive layer ("EML"). The substrates may then be masked and placed in a vacuum chamber. A layer of electron transport material may be deposited by thermal evaporation, followed by a layer of electron injection material, to form the electron transport layer ("ETL") and the electron injection layer ("EIL"). Masks may then be changed in vacuo and a layer of Al may be deposited by thermal evaporation. The chamber may be vented, and the devices may be encapsulated using a glass lid, dessicant, and UV curable epoxy.

The OLED devices may be characterized by measuring their (1) current-voltage (I-V) curves, (2) electroluminescence radiance versus voltage, and (3) electroluminescence spectra versus voltage. All three measurements may be performed at the same time and controlled by a computer. The current efficiency of the device at a certain voltage may be determined by dividing the electroluminescence radiance of the LED by the current density needed to run the device. The unit is a cd/A. The power efficiency is the current efficiency divided by the operating voltage. The unit is lm/W. The color coordinates may be determined using either a Minolta CS-100 meter or a Photoresearch PR-705 meter.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A compound having Formula I

(I)

wherein:

BCz is a substituted or unsubstituted benzocarbazole unit;

$L^1$ and $L^2$ are the same or different and are selected from the group consisting of H, D, halogen, aryl, arylamino, crosslinkable groups, deuterated aryl, deuterated arylamino, and deuterated crosslinkable groups;

$Q^1$ and $Q^2$ are the same or different and are selected from the group consisting of a single bond, alkyl, aryl, diarylamino, triarylamino, deuterated alkyl, deuterated aryl, deuterated diarylamino, and deuterated triarylamino, wherein at least one of $Q^1$ or $Q^2$ is not a single bond; and n is an integer of 10 to 100,000.

2. The compound of claim 1, wherein BCz is selected from the group consisting of BCz-A, BCz-B, and BCz-C

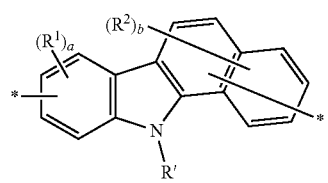

BCz-A

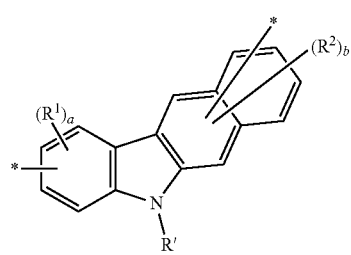

BCz-B

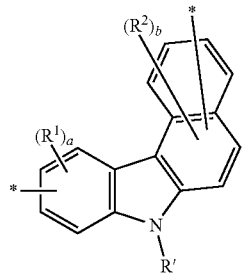

BCz-C wherein:

R' is selected from the group consisting of alkyl, cycloalkyl, fluoroalkyl, silyl, germyl, aryl, heteroaryl, triarylamino, and deuterated analogs thereof;

$R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R' and/or $R^2$ groups can be joined together to form a fused ring;

a is an integer from 0-3;

b is an integer from 0-5; and

* indicates a point of attachment to $Q^1$ or $Q^2$.

3. The compound of claim 1, wherein BCz is selected from the group consisting of BCz-A1, BG-B1 and BCz-C1

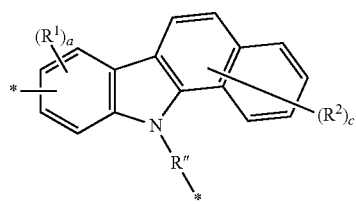

BCz-A1

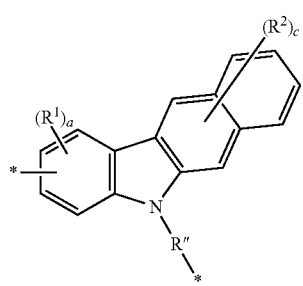

BCz-B1

-continued

BCz-C1

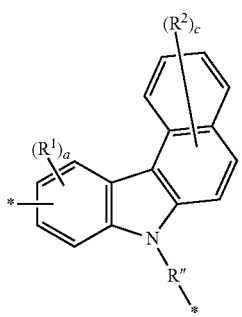

where
- R" is selected from the group consisting of alkyl, cycloalkyl, fluoroalkyl, silyl, germyl, aryl, heteroaryl, triarylamino, and deuterated analogs thereof;
- $R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;
- a is an integer from 0-3;
- c is an integer from 0-6; and
- * indicates a point of attachment to $Q^1$ or $Q^2$.

4. The compound of claim 1, wherein BCz is selected from the group consisting of BCz-A2, BCz-B2, and BCz-C2

BCz-A2

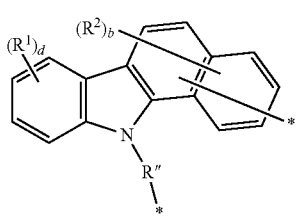

BCz-B2

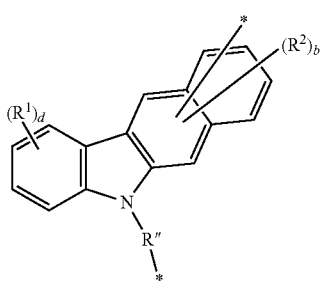

-continued

BCz-C2

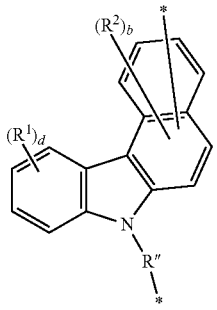

where
- R" is selected from the group consisting of alkyl, cycloalkyl, fluoroalkyl, silyl, germyl, aryl, heteroaryl, triarylamino, and deuterated analogs thereof;
- $R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent R' and/or $R^2$ groups can be joined together to form a fused ring;
- b is an integer from 0-5;
- d is an integer from 0-4; and
- * indicates a point of attachment to $Q^1$ or $Q^2$.

5. The compound of claim 1, wherein $Q^1$ is a hydrocarbon aryl group having 6-36 ring carbons or deuterated analog.

6. The compound of claim 1, wherein $Q^1$ is a diarylamino group having Formula e Formula e

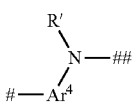

where:
- R' is selected from the group consisting of alkyl, cycloalkyl, fluoroalkyl, silyl, germyl, aryl, heteroaryl, triarylamino, and deuterated analogs thereof;
- $Ar^4$ is selected from the group consisting of aryl, heteroaryl, and deuterated analogs thereof;
- # indicates a point of attachment; and
- ## indicates a point of attachment to BCz.

7. The compound of claim 6, wherein R' is a hydrocarbon aryl group and has at least one substituent selected from the group consisting of D, F, CN, alkyl, alkoxy, silyl, siloxy, siloxane, aryl, heteroaryl, diarylamino, carbazolyl, deuterated alkyl, deuterated alkoxy, deuterated silyl, deuterated siloxy, deuterated siloxane, deuterated aryl, deuterated heteroaryl, deuterated diarylamino, and deuterated carbazolyl.

8. The compound of claim 1, wherein Q1 is a triarylamino group having Formula f

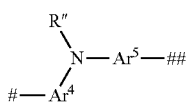

Formula f where:
- R'' is selected from the group consisting of alkyl, cycloalkyl, fluoroalkyl, silyl, germyl, aryl, heteroaryl, triarylamino, and deuterated analogs thereof;
- $Ar^4$, and $Ar^5$ are the same or different and are selected from the group consisting of aryl, heteroaryl, and deuterated analogs thereof;
- # indicates a point of attachment; and
- ## indicates a point of attachment to BCz.

9. The compound of claim 1, wherein the compound has Formula I-a

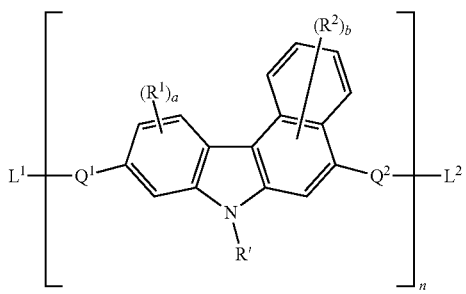

I-a wherein:
- R' is selected from the group consisting of alkyl, cycloalkyl, fluoroalkyl, silyl, germyl, aryl, heteroaryl, triarylamino, and deuterated analogs thereof;
- $R^1$ and $R^2$ are the same or different at each occurrence and are selected from the group consisting of D, F, CN, aryl, heteroaryl, aryloxy, fluoroaryl, alkyl, fluoroalkyl, alkoxy, fluoroalkoxy, amino, silyl, siloxane, siloxy, germyl, deuterated aryl, deuterated heteroaryl, deuterated aryloxy, deuterated fluoroaryl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring;
- $L^1$ and $L^2$ are the same or different and are selected from the group consisting of H, D, halogen, aryl, arylamino, crosslinkable groups, deuterated aryl, deuterated arylamino, and deuterated crosslinkable groups;
- Q1 and Q2 are the same or different and are selected from the group consisting of a single bond, alkyl, aryl, diarylamino, triarylamino, deuterated alkyl, deuterated aryl, deuterated diarylamino, and deuterated triarylamino, wherein at least one of $Q^1$ or $Q^2$ is not a single bond;
- a is an integer from 0-3;
- b is an integer from 0-5; and
- n is an integer of 10 to 100,000.

10. An electronic device comprising an anode, a cathode, and an organic active layer therebetween, where the organic active layer comprises the compound of claim 1.

11. The compound of claim 1, wherein the compound is a homopolymer.

12. The compound of claim 2, wherein a=b=0.

13. The compound of claim 2, wherein $R^1$ and $R^2$ are the same or different at each occurrence and are selected from the group consisting of D, F, CN, alkyl, fluoroalkyl, alkoxy, fluoroalkoxy, amino, silyl, siloxane, siloxy, germyl, deuterated alkyl, deuterated fluoroalkyl, deuterated alkoxy, deuterated fluoroalkoxy, deuterated amino, deuterated silyl, deuterated siloxane, deuterated siloxy, and deuterated germyl, wherein adjacent $R^1$ and/or $R^2$ groups can be joined together to form a fused ring.

* * * * *